United States Patent
Chen et al.

(10) Patent No.: US 12,166,054 B2
(45) Date of Patent: Dec. 10, 2024

(54) IMAGE SENSOR WITH PASSIVATION LAYER FOR DARK CURRENT REDUCTION

(71) Applicant: Taiwan Semiconductor Manufacturing Company, Ltd., Hsinchu (TW)

(72) Inventors: Hsiang-Lin Chen, Hsinchu County (TW); Yi-Shin Chu, Hsinchu (TW); Yin-Kai Liao, Taipei (TW); Sin-Yi Jiang, Hsinchu (TW); Kuan-Chieh Huang, Hsinchu (TW); Jhy-Jyi Sze, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 18/446,572

(22) Filed: Aug. 9, 2023

(65) Prior Publication Data

US 2023/0387159 A1    Nov. 30, 2023

Related U.S. Application Data

(62) Division of application No. 17/177,696, filed on Feb. 17, 2021, now Pat. No. 11,848,345.

(Continued)

(51) Int. Cl.
*H01L 27/146* (2006.01)
*H01L 31/105* (2006.01)

(52) U.S. Cl.
CPC .... *H01L 27/14623* (2013.01); *H01L 31/1055* (2013.01); *H01L 27/14685* (2013.01)

(58) Field of Classification Search
CPC ........... H01L 27/14623; H01L 31/1055; H01L 27/14685; H01L 27/14634;

(Continued)

(56) References Cited

U.S. PATENT DOCUMENTS

| | | | |
|---|---|---|---|
| 2016/0141317 A1 | 5/2016 | Tekleab | |
| 2018/0188356 A1* | 7/2018 | Na | G01S 17/10 |

(Continued)

FOREIGN PATENT DOCUMENTS

| | | |
|---|---|---|
| CN | 110473888 A | 11/2019 |
| JP | H05175536 A | 7/1993 |

(Continued)

OTHER PUBLICATIONS

Notice of Allowance dated Aug. 10, 2023 for U.S. Appl. No. 17/177,696.

(Continued)

*Primary Examiner* — Samuel Park

(74) *Attorney, Agent, or Firm* — Eschweiler & Potashnik, LLC

(57) ABSTRACT

Various embodiments of the present disclosure are directed towards an image sensor with a passivation layer for dark current reduction. A device layer overlies a substrate. Further, a cap layer overlies the device layer. The cap and device layers and the substrate are semiconductor materials, and the device layer has a smaller bandgap than the cap layer and the substrate. For example, the cap layer and the substrate may be silicon, whereas the device layer may be or comprise germanium. A photodetector is in the device and cap layers, and the passivation layer overlies the cap layer. The passivation layer comprises a high k dielectric material and induces formation of a dipole moment along a top surface of the cap layer.

20 Claims, 33 Drawing Sheets

Related U.S. Application Data

(60) Provisional application No. 63/084,697, filed on Sep. 29, 2020.

(58) Field of Classification Search
CPC ......... H01L 27/14636; H01L 27/14689; H01L 31/02161; H01L 31/1808; H01L 27/1464; H01L 27/1461; H01L 27/1462; H01L 27/14643; H01L 27/14649; G01S 7/4863
See application file for complete search history.

(56) References Cited

U.S. PATENT DOCUMENTS

| | | |
|---|---|---|
| 2018/0247968 A1 | 8/2018 | Na et al. |
| 2020/0013824 A1 | 1/2020 | Sun et al. |
| 2020/0020734 A1 | 1/2020 | Wang et al. |
| 2020/0035741 A1 | 1/2020 | Liu et al. |
| 2020/0319345 A1* | 10/2020 | Cheng ............... H01L 27/14616 |

FOREIGN PATENT DOCUMENTS

| | | |
|---|---|---|
| TW | 202017161 A | 5/2020 |
| WO | 2018117485 A1 | 6/2018 |

OTHER PUBLICATIONS

Kamimuta et al. "Comprehensive Study of VFB Shift in High-k CMOS—Dipole Formation, Fermi-level Pinning and Oxygen Vacancy Effect -" 2007 IEEE International Electron Devices Meeting, published on Jan. 4, 2018.

Toriumi et al. "Anomalous VFB Shift in High-k Gate Stacks—Is its origin at the top or bottom interface?—" ECS Transactions, 25 (6) 3-16 (2009), published in 2009.

Clark, Robert D. "Emerging Applications for High K Materials in VLSI Technology" Materials 2014, 7, 2913-2944; doi:10.3390/ma7042913, published on Apr. 10, 2014.

Non-Final Office Action dated Apr. 27, 2023 for U.S. Appl. No. 17/177,696.

* cited by examiner

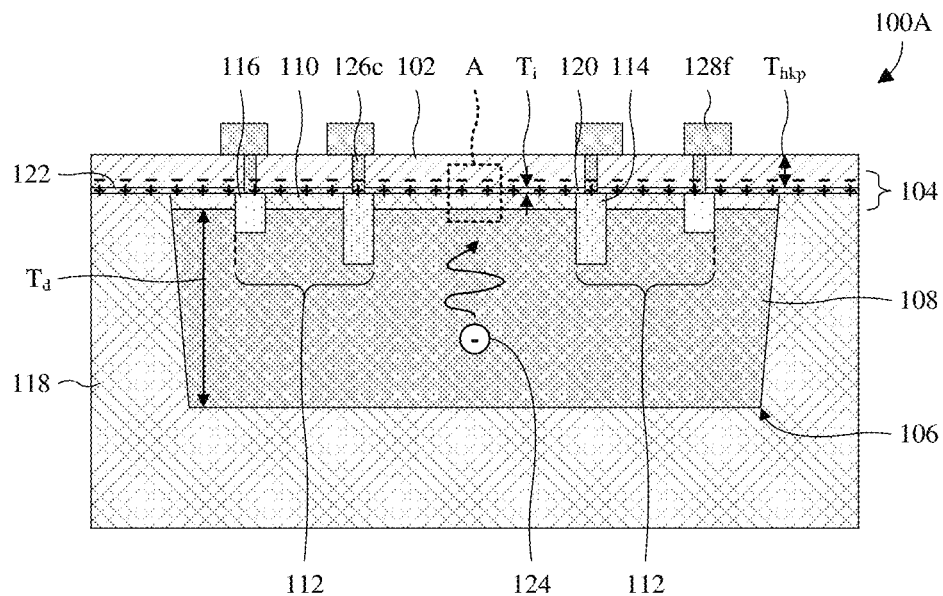
Fig. 1A
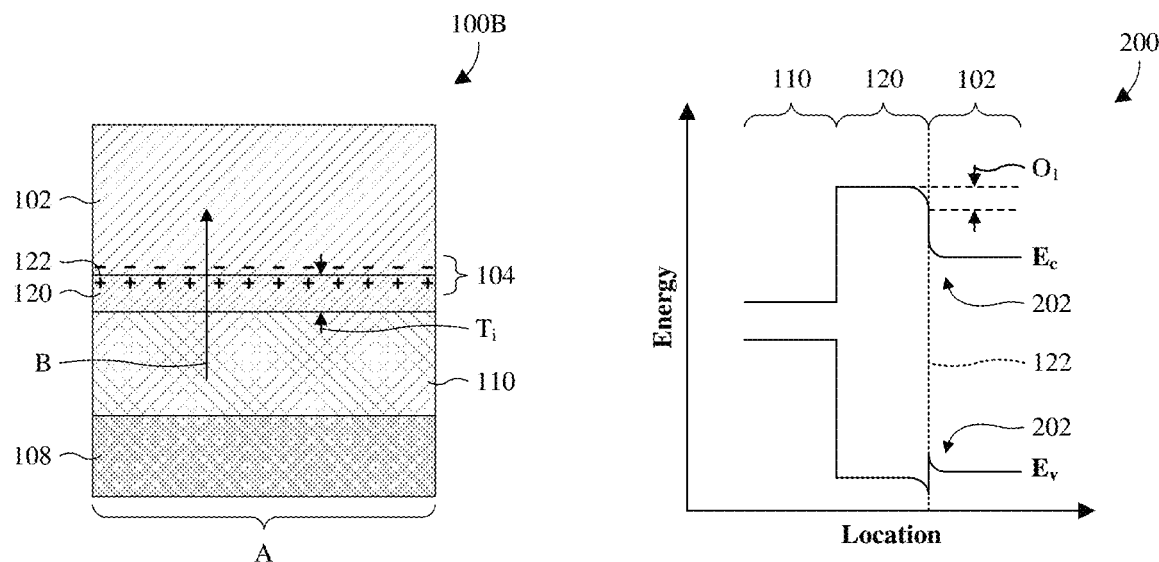
Fig. 1B
Fig. 2

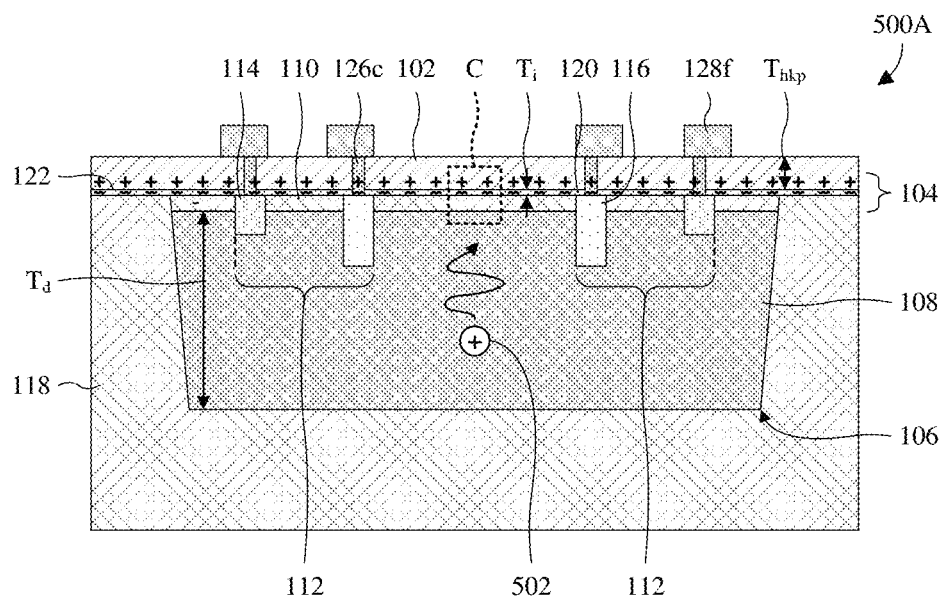
Fig. 5A
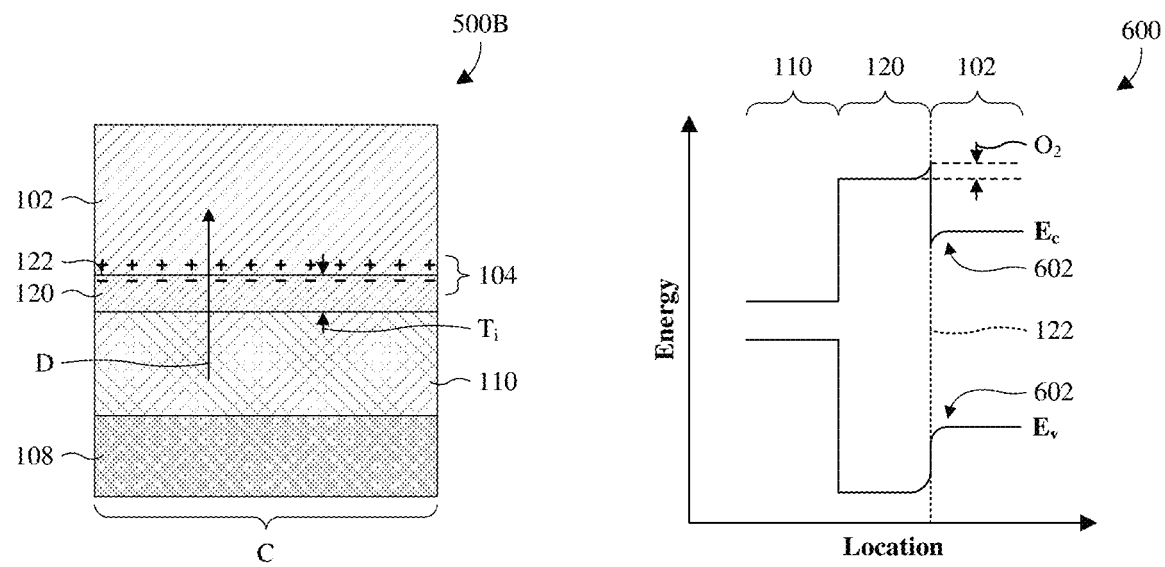
Fig. 5B
Fig. 6

IMAGE SENSOR WITH PASSIVATION LAYER FOR DARK CURRENT REDUCTION

REFERENCE TO RELATED APPLICATIONS

This Application is a Divisional of U.S. application Ser. No. 17/177,696, filed on Feb. 17, 2021, which claims the benefit of U.S. Provisional Application No. 63/084,697, filed on Sep. 29, 2020. The contents of the above-referenced Patent Applications are hereby incorporated by reference in their entirety.

BACKGROUND

Integrated circuits (IC) with image sensors are used in a wide range of modern-day electronic devices, such as, for example, cameras and cell phones. In recent years, complementary metal-oxide-semiconductor (CMOS) image sensors have begun to see widespread use, largely replacing charge-coupled devices (CCD) image sensors. Compared to CCD image sensors, CMOS image sensors are increasingly favored due to low power consumption, small size, fast data processing, direct output of data, and low manufacturing cost. Some types of CMOS image sensors include frontside illuminated (FSI) image sensors and backside illuminated (BSI) image sensors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A and 1B illustrate various cross-sectional views of some embodiments of an image sensor in which a passivation layer is configured to reduce dark current.

FIG. 2 illustrates some embodiments of an energy band diagram at an interfacial layer of the image sensor of FIGS. 1A and 1B.

FIGS. 5A and 5B illustrate various cross-sectional views of some alternative embodiments of the image sensor of FIGS. 1A and 1B in which a polarity of the dipole moment is reversed.

FIG. 6 illustrates some embodiments of an energy band diagram at an interfacial layer of the image sensor of FIGS. 5A and 5B.

DETAILED DESCRIPTION

Figure 3:
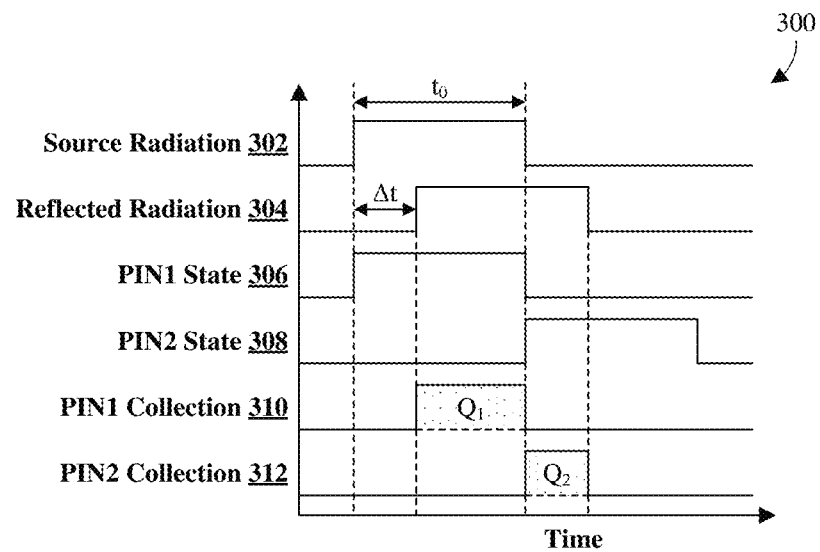
FIG. 3 illustrates a timing diagram for some embodiments of signals during operation of the image sensor of FIGS. 1A and 1B.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A complementary metal-oxide-semiconductor (CMOS) image sensor may be employed to detect near infrared (NIR) and infrared (IR) radiation. This may arise for CMOS image sensors employed for time-of-flight (ToF) imaging and other suitable types of imaging. However, CMOS image sensors are typically silicon based. Silicon has a large bandgap and is hence poor at absorption of NIR and IR radiation. Therefore, silicon-based CMOS image sensors may have poor quantum efficiency (QE) for NIR and IR radiation. To mitigate the poor QE, silicon-based CMOS image sensors may be replaced by CMOS image sensors based on an alternative semiconductor material with a smaller bandgap than silicon. A non-liming example of such an alternative semiconductor material is germanium.

A CMOS image sensor based on an alternative semiconductor material and employed for ToF imaging may comprise a device layer and a cap layer. The device layer overlies and is inset into a top of a semiconductor substrate, and the cap layer overlies the device layer. Further, the semiconductor substrate and the cap layer are silicon, whereas the device layer is or comprises the alternative semiconductor material. Two PIN diodes are in the cap layer and the device layer and are respectively on opposite sides of the device layer. A passivation layer of silicon dioxide (e.g., $SiO_2$) overlies and directly contacts the cap layer, and contact vias extend through the passivation layer to contact regions of the PIN diodes.

The smaller bandgap of the alternative semiconductor material allows enhanced QE. However, the smaller bandgap also leads to higher dark current, which negatively impacts performance gains from using the alternative semiconductor material. For example, during ToF imaging, the PIN diodes may be used at different time intervals to respectively measure incident radiation. The measurements may then be used to determine a distance to the object. Mobile electrons from the dark current may collect at the PIN diodes, thereby leading inaccuracies in the measurements and hence in the distance determination.

Various embodiments of the present disclosure are directed towards an image sensor with a passivation layer for dark current reduction, as well as a method for forming the image sensor. In some embodiments of the image sensor, a device layer overlies a substrate. Further, a cap layer overlies the device layer. The cap and device layers and the substrate are semiconductor materials, and the device layer has a smaller bandgap than the cap layer and the substrate. For example, the cap layer and the substrate may be silicon, whereas the device layer may be or comprise germanium. Note that other suitable materials are, however, amenable in alternative embodiments. A photodetector is in the device and cap layers, and the passivation layer overlies the cap layer. The passivation layer comprises a high k dielectric material and induces formation of a dipole moment along a top surface of the cap layer.

Because of the dipole moment along the top surface of the cap layer, mobile charge carriers (e.g., mobile electrons) of the dark current may be drawn to the top surface of the cap layer and neutralized. This may, in turn, prevent the dark current from negatively impacting performance of the photodetector. For example, when the image sensor is employed for ToF imaging, the photodetector may comprise a pair of PIN junctions. As above, the PIN junctions may be respectively on opposite sides of the device layer and may be used to determine a distance to an object. The dipole moment may draw mobile electrons of the dark current away from the PIN junctions, so the dark current does not impact measurements from the PIN junction. As a result, the measurements and hence the distance determination may be more accurate.

With reference to FIGS. 1A and 1B, various cross-sectional views 100A, 100B of some embodiments of an image sensor is provided in which a high k passivation layer 102 is configured to induce a dipole moment 104 over a photodetector 106 to reduce dark current. FIG. 1B corresponds to an enlarged cross-sectional view 100B of a portion of the image sensor within box A in FIG. 1A. The photodetector 106 underlies the high k passivation layer 102 in a device layer 108 and a cap layer 110. Further, the photodetector 106 comprises a pair of PIN diodes 112. The PIN diodes 112 are respectively on opposite sides of the device layer 108 and comprise individual P-type contact regions 114 and individual N-type contact regions 116.

The device layer 108 is recessed into a top of a substrate 118, and the cap layer 110 separates the device layer 108 from the high k passivation layer 102. The device layer 108, the cap layer 110, and the substrate 118 are semiconductor materials, and the device layer 108 is a different semiconductor material than the cap layer 110 and the substrate 118. The device layer 108 may be or comprise germanium, silicon germanium, some other suitable semiconductor material(s), or any combination of the foregoing. The substrate 118 and the cap layer 110 may, for example, be or comprise silicon and/or some other suitable semiconductor material(s). In some embodiments, a bulk of the device layer 108 is undoped or lightly doped and/or the cap layer 110 is undoped or lightly doped. In some embodiments, a bulk of the substrate 104 has a P-type or N-type doping. As used herein, light doping means that a doping concentration is less than about $1 \times 10^{15}$ atoms per cubic centimeter (e.g., $cm^{-3}$) or some other suitable value.

The high k passivation layer 102 overlies the cap layer 110, and an interfacial layer 120 is between the high k passivation layer 102 and the cap layer 110. The high k passivation layer 102 is a high k dielectric material with a dielectric constant in excess of 3.9, 10, or some other suitable value. Further, the high k passivation layer 102 is deposited directly on the cap layer 110 during formation of the image sensor. The high k passivation layer 102 reacts with the cap layer 110 to form the interfacial layer 120 between the high k passivation layer 102 and the cap layer 110. For example, the high k passivation layer 102 and the cap layer 110 may respectively comprise a metal oxide and silicon, such that oxygen of the high k passivation layer 102 reacts with silicon of the cap layer 110 to form the interfacial layer 120 as silicon oxide.

The interfacial layer 120 is a dielectric having a different band gap than the high k passivation layer 102 and a smaller areal oxygen density than that of the high k passivation layer 102. Because of the different band gaps, band bending occurs at an interface 122 between the interfacial layer 120 and the high k passivation layer 102. The band bending, in turn, induces formation of the dipole moment 104 at the interface 122. Further, because the interfacial layer 120 has a smaller areal oxygen density than that of the high k passivation layer 102, negative charge (schematically illustrated by minus signs) accumulates in the high k passivation layer 102 along the interface 122, whereas positive charge (schematically illustrated by plus signs) accumulates in the interfacial layer 120 along the interface 122.

As explained in more detail hereafter, the image sensor is employed for ToF imaging. Radiation is emitted towards an object. Reflected radiation then impinges on the photodetector 106 to generate electron-hole pairs. At different times, the PIN diodes 112 collect mobile electrons of the electron-hole pairs respectively in the N-type contact regions 116. The collected electrons at the different time intervals are then measured and used to determine a distance to the object. The positive charge of the dipole moment 104 draws mobile electrons 124 of dark current in the device layer 108 away from the PIN diodes 112 and neutralizes the mobile electrons 124. By neutralizing the mobile electrons 124, dark current is reduced and does not collect at the N-type contact regions 116 of the PIN diodes 112. As a result, the measurements using the PIN diodes 112 are more accurate and hence the distance determination is more accurate.

A plurality of contact vias 126c and a plurality of first-level wires 128f are stacked over the cap layer 110. The first-level wires 128f overlie the high k passivation layer 102. The contact vias 126c extend through the high k passivation layer 102 and the interfacial layer 120, respectively from the P-type and N-type contact regions 114, 116 respectively to the first-level wires 128f. Further, the contact vias 126c have top surfaces level with a top surface of the high k passivation layer 102. In alternative embodiments, the top surfaces of the contact vias 126c are above or below the top surface of the high k passivation layer 102. The first-level wires 128f and the contact vias 126c may, for example, be or comprise metal(s) and/or some other suitable conductive material(s).

In some embodiments, the high k passivation layer 102 is or comprises aluminum oxide (e.g., $Al_2O_3$), titanium oxide (e.g., $TiO_2$), tantalum oxide (e.g., $Ta_2O_5$), hafnium oxide ($HfO_2$), zirconium oxide (e.g., $ZrO_2$), magnesium oxide (e.g., MgO), some other suitable high k dielectric(s), or any combination of the foregoing. In some embodiments, the high k passivation layer 102 has a dielectric constant greater than that of the interfacial layer 120 and/or has a smaller bandgap than that of the interfacial layer 120. In some embodiments, the high k passivation layer 102 has a thickness $T_{hkp}$ of about 1-10 nanometers, about 1-5 nanometers, about 5-10 nanometers, or some other suitable value. If the thickness $T_{hkp}$ is too large (e.g., greater than about 10 nanometers or some other suitable value), intrinsic defects in the high k passivation layer 102 may lead to high leakage current that negates performance gains from the dipole moment 104. On the other hand, if the thickness $T_{hkp}$ is too small (e.g., less than about 1 nanometer or some other suitable value), the dipole moment 104 may not form and hence performance gains from the dipole moment 104 may not result.

In some embodiments, the interfacial layer 120 is or comprises a semiconductor element from the substrate 118 and oxygen and/or some other suitable element(s) from the high k passivation layer 102. For example, the interfacial layer 120 may comprise silicon from the substrate 118 and oxygen from the high k passivation layer 102. In some embodiments, the interfacial layer 120 is or comprise silicon dioxide (e.g., $SiO_2$) and/or some other suitable dielectric(s). In some embodiments, the interfacial layer 120 has a thickness $T_i$ of about 0.5-2.5 nanometers, about 0.5-1.5 nanometers, or about 1.5-2.5 nanometers, or some other suitable value.

In some embodiments, the device layer 108 has a small bandgap relative to silicon, the substrate 118, the cap layer 110, or any combination of the foregoing. For example, the device layer 108 may be or comprise germanium, whereas the cap layer 110 and the substrate 118 may be silicon. In some embodiments, the small bandgap results in the device layer 108 having a high absorption coefficient for NIR and/or IR radiation relative to silicon, the substrate 118, the cap layer 110, or any combination of the foregoing. NIR radiation may, for example, include wavelengths of about 850-940 nanometers, about 850-1350 nanometers, about 850-1180 nanometers, about 1180-1350 nanometers, some other suitable wavelengths, or any combination of the foregoing. IR radiation may, for example, include wavelengths of about 1.5-30 micrometers and/or other suitable wavelengths. In some embodiments, the small bandgap results in the device layer 108 having a high QE greater than about 80% or some other suitable value for wavelengths of about 850-940 nanometers and for other suitable wavelengths.

In some embodiments, the device layer 108 has a height Ha that is about 2-50 micrometers, about 2-26 micrometers, about 25-50 micrometers, or some other suitable value. If the height Ha is too small (e.g., less than about 2 micrometers or some other suitable value), the device layer 108 may have poor absorption for incident radiation and the photodetector 106 may have poor performance. If the height Ha is too large (e.g., greater than about 50 micrometers or some other suitable value), formation of the device layer 108 recessed into the substrate 118 may take a long time and may significantly impact manufacturing throughput.

With reference to FIG. 2, some embodiments of an energy band diagram 200 along line B of FIGS. 1A and 1B is provided in which band bending 202 occurs at the interface 122 between the high k passivation layer 102 and the interfacial layer 120. As a result, a conduction band $E_c$ arcs upward from the interface 122 towards the interfacial layer 120, thereby resulting in an energy offset $O_1$ that is positive. The same occurs at the valence band $E_v$. Because the energy offset $O_1$ is positive, positive charge of the dipole moment 104 is in the interfacial layer 120 and negative charge of the dipole moment 104 is in the high k passivation layer 102. If the energy offset $O_1$ was negative, positive charge of the dipole moment 104 would in the high k passivation layer 102 and negative charge of the dipole moment 104 would be in the interfacial layer 120.

In some embodiments, the cap layer 110 is silicon, the high k passivation layer 102 is aluminum oxide (e.g., $Al_2O_3$), and the interfacial layer 120 is silicon oxide (e.g., $SiO_2$) In at least some of such embodiments, the energy offset $O_1$ is 0.57 electron volts (eV). In other embodiments, the cap layer 110 is silicon, the high k passivation layer 102 is hafnium oxide (e.g., $HfO_2$), and the interfacial layer 120 is silicon oxide (e.g., $SiO_2$) In at least some of such embodiments, the energy offset $O_1$ is 0.31 eV. In other embodiments, different materials are amenable.

With reference to FIG. 3, a timing diagram 300 for some embodiments of signals during operation of the image sensor of FIGS. 1A and 1B is provided. The horizontal axis corresponds to time, whereas the vertical axis corresponds to signal state.

As denoted by a source radiation signal 302, source radiation is initially emitted towards an object for a duration to. The source radiation may, for example, be emitted from the image sensor or from proximate the image sensor and/or may, for example, be emitted by a laser diode or some other suitable radiation source. The source radiation may, for example, be NIR radiation, IR radiation, or some other suitable type of radiation.

As denoted by a reflected radiation signal 304, the source radiation reflects off the object and impinges on the photodetector 106 after a time Δt. As a result, reflected radiation impinges on the photodetector 106 for the duration to.

As denoted by a PIN1 state signal 306 and a PIN2 state signal 308 respectively for the PIN diodes 112 of FIGS. 1A and 1B, the PIN diodes 112 are in ON states respectively at different, non-overlapping time intervals. A first PIN diode is in an ON state for the duration to while the source radiation is being emitted and is otherwise in an OFF state. Additionally, a second PIN diode is in an ON state for the duration to immediately after emission of the source radiation and is otherwise in an OFF state.

The PIN diodes 112 are each in an ON state when reverse biased and an OFF state when forward biased or otherwise unbiased. Practically, the ON/OFF states of the PIN diodes 112 are controlled by bias voltages at the P-type contact regions 114 of FIGS. 1A and 1B. While any one of the PIN diodes 112 is in an ON state, mobile electrons generated in response to the reflected radiation collect at a corresponding one of the N-type contact regions 116 of FIGS. 1A and 1B. Further, a capacitor individual to and electrically coupled to the N-type contact region stores electrons collected at the N-type contact region. Note that capacitors individual to the N-type contact regions 116 are not shown in FIGS. 1A and 1B.

As denoted by a PIN1 collection signal 310 and a PIN2 collection signal 312 respectively for the PIN diodes 112, the PIN diodes 112 collect mobile electrons generated in response to the reflected radiation at the different, non-overlapping time intervals. The first PIN diode collects a first amount $Q_1$ of electrons while the first PIN diode is in the ON state, whereas the second PIN diode collects a second amount $Q_2$ of electrons while the second PIN diode is in the ON state. As noted above, the mobile electrons collect at the N-type contact regions 116 of FIGS. 1A and 1B, such that the PIN1 and PIN2 collection signals 310, 312 correspond to signals at the N-type contact regions 116.

By knowing the time $\Delta t$, the distance D to the object may be determined as follows:

$$D = \frac{1}{2}c\Delta t,$$

where c is the speed of light. However, $\Delta t$ is not readily known. Nonetheless, $\Delta t$ may be determined from the duration to, which is readily known, as well as the first and second amounts $Q_1$, $Q_2$ of electrons collected by the PIN diodes 112. Particularly, $\Delta t$ may be determined as follows:

$$\Delta t = t_0\left(\frac{Q_2}{Q_1 + Q_2}\right).$$

Therefore, the distance D may be determined as follows:

$$D = \frac{1}{2}ct_0\left(\frac{Q_2}{Q_1 + Q_2}\right).$$

Because the determined distance D depends on the first and second amounts $Q_1$, $Q_2$, the accuracy of the determined distance D depends on the accuracy of the first and second amounts $Q_1$, $Q_2$. Further, if mobile electrons of dark current migrate to and are collected by the PIN diodes 112 in FIGS. 1A and 1B, the dark current may negatively impact the accuracy of the first and second amounts $Q_1$, $Q_2$ and may hence negatively impact the accuracy of the determined distance D. Because of the dipole moment 104 in FIGS. 1A and 1B, the dark current electrons are drawn away from the PIN diodes 112. This prevents the dark current electrons from being collected by the PIN diodes 112 or otherwise reduces the amount of dark current electrons collected by the PIN diodes 112. Hence, the dipole moment 104 reduces the impact of dark current on the accuracy of the first and second amounts $Q_1$, $Q_2$ and the accuracy of the determined distance D.

Figure 4:
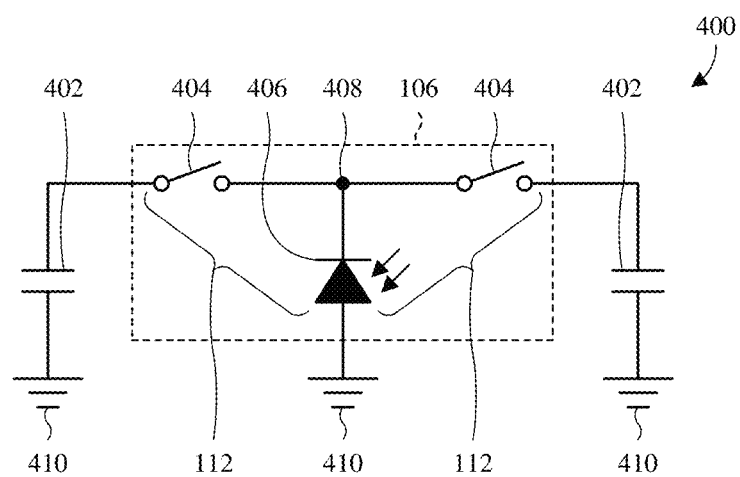
FIG. 4 illustrates an equivalent circuit of some embodiments of the image sensor of FIGS. 1A and 1B.

With reference to FIG. 4, an equivalent circuit 400 of some embodiments of the image sensor of FIGS. 1A and 1B is provided. The image sensor comprises the photodetector 106 and a pair of capacitors 402. The photodetector 106 is equivalent to a pair of switches 404 and a photodiode 406 electrically coupled to a common node 408. A cathode of the photodiode 406 is electrically coupled to the common node 408, whereas an anode of the photodiode 406 is electrically coupled to ground 410. The switches 404 are electrically coupled from the common node 408 respectively to the capacitors 402, and the capacitors 402 are electrically coupled respectively from the switches 404 to ground 410.

The switches 404 correspond to the PIN diodes 112 in FIGS. 1A and 1B. When a switch is in an ON state, a respective PIN diode is in a reverse biased state and wholly or partially functions as the photodiode 406. When a switch is in an OFF state, a respective PIN diode is in a forward biased state or an unbiased state and is independent of the photodiode 406. With reference to FIG. 3, the PIN1 and PIN2 state signals 306, 308 correspond to the ON/OFF states of the switches 404. Further, the PIN1 and PIN2 collection signals 310, 312 correspond to the mobile electrons collected and transferred to the capacitors 402.

With reference to FIGS. 5A and 5B, various cross-sectional views 500A, 500B of some alternative embodiments of the image sensor of FIGS. 1A and 1B are provided in which a polarity of the dipole moment 104 is reversed. FIG. 5B corresponds to an enlarged cross-sectional view 500B of a portion of the image sensor within box C in FIG. 5A. Because the polarity of the dipole moment 104 is reversed, negative charge (schematically illustrated by minus signs) of the dipole moment 104 accumulates in the interfacial layer 120 along the interface 122, whereas positive charge (schematically illustrated by plus signs) of the dipole moment 104 accumulates in the high k passivation layer 102 along the interface 122.

The polarity of the dipole moment 104 is reversed because the interfacial layer 120 has a larger areal oxygen density than that of the high k passivation layer 102. In some embodiments, the interfacial layer 120 is or comprises silicon oxide and/or some other suitable dielectric(s). In some embodiments, the high k passivation layer 102 is or comprises barium oxide (e.g., BaO), strontium oxide (e.g., SrO), lanthanum oxide (e.g., $La_2O_3$), yttrium oxide (e.g., $Y_2O_3$), some other suitable high k dielectric(s), or any combination of the foregoing.

In addition to the polarity of the dipole moment 104 being reversed, the N-type contact regions 116 are between the P-type contact regions 114. Further, the N-type contact regions 116 extend into the device layer 108 to a greater depth than the P-type contact regions 114. In alternative embodiments, the P-type contact regions 114 are between the N-type contact regions 116 as in FIGS. 1A and 1B and/or the N-type contact regions 116 extend into the device layer 108 to a lesser depth than the P-type contact regions 114 as in FIGS. 1A and 1B.

Similar to FIGS. 1A and 1B, the image sensor is employed for ToF imaging. Radiation is emitted towards an object. Reflected radiation then impinges on the photodetector 106 to generate electron-hole pairs. At different times, the PIN diodes 112 collect mobile holes of the electron-hole pairs respectively in the P-type contact regions 114. The collected holes at the different time intervals are then measured and used to determine a distance to the object. The negative charge of the dipole moment 104 draws mobile holes 502 of dark current in the device layer 108 away from the PIN diodes 112 and neutralizes the mobile holes 502. By neutralizing the mobile holes 502, dark current is reduced and does not collect at the P-type contact regions 114 of the PIN diodes 112. As a result, the measurements using the PIN diodes 112 are more accurate and hence the distance determination is more accurate.

With reference to FIG. 6, some embodiments of an energy band diagram 600 along line D of FIGS. 5A and 5B is provided in which band bending 602 occurs at the interface 122 between the high k passivation layer 102 and the interfacial layer 120. As a result, a conduction band $E_c$ arcs downward from the interface 122 towards the interfacial layer 120, thereby resulting in an energy offset $O_2$ that is negative. The same occurs at the valence band $E_v$. Because the energy offset $O_2$ is negative, negative charge of the dipole moment 104 is in the interfacial layer 120 and positive charge of the dipole moment 104 is in the high k passivation layer 102. If the energy offset $O_2$ was positive, negative charge of the dipole moment 104 would in the high k passivation layer 102 and positive charge of the dipole moment 104 would be in the interfacial layer 120.

In some embodiments, the cap layer 110 is silicon, the high k passivation layer 102 is yttrium oxide (e.g., $Y_2O_3$), and the interfacial layer 120 is silicon oxide (e.g., $SiO_2$). In at least some of such embodiments, the energy offset $O_2$ is −0.23 eV. In other embodiments, different materials are amenable.

Figure 7:
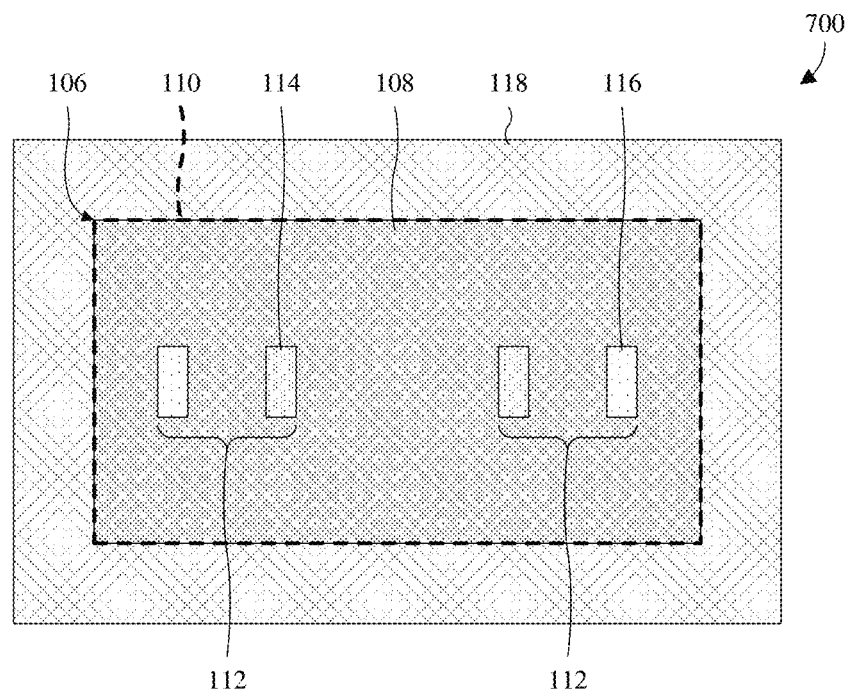
FIG. 7 illustrates a top layout of some embodiments of the image sensor of FIGS. 1A and 1B.

With reference to FIG. 7, a top layout 700 of some embodiments of the image sensor of FIGS. 1A and 1B is provided along an interface between the cap layer 110 (shown in phantom) and the device layer 108. The PIN diodes 112 are respectively on opposite sides of the device layer 108. The P-type and N-type contact regions 114, 116 have rectangular layouts that are elongated in parallel, and the P-type contact regions 114 are between the N-type contact regions 116. In alternative embodiments, the P-type and N-type contact regions 114, 116 have some other suitable layout and/or the N-type contact regions 116 are between the P-type contact regions 114.

Figure 8A:
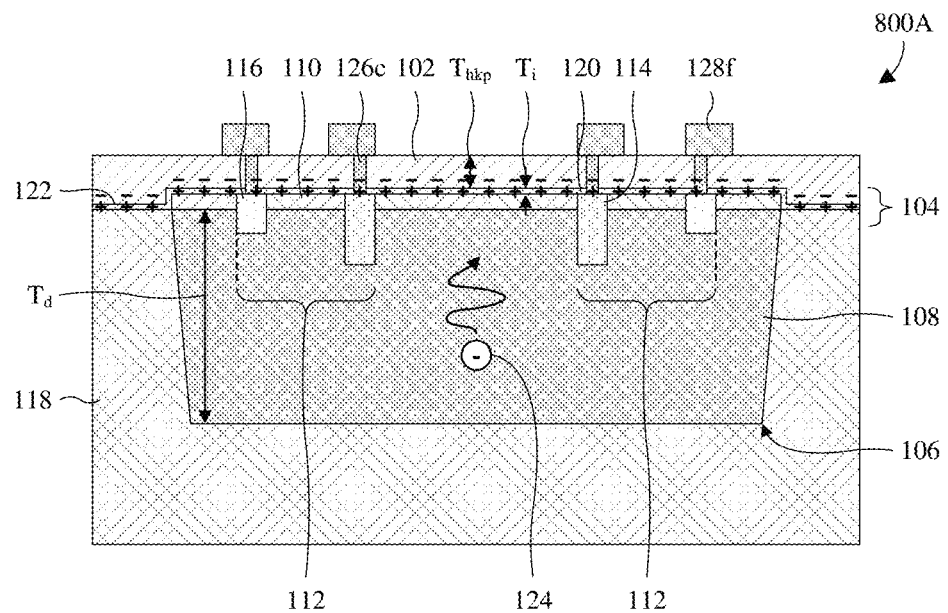
FIGS. 8A and 8B illustrate various cross-sectional views of some alternative embodiments of the image sensor of FIGS. 1A and 1B in which a photodetector is varied.
Figure 8B:
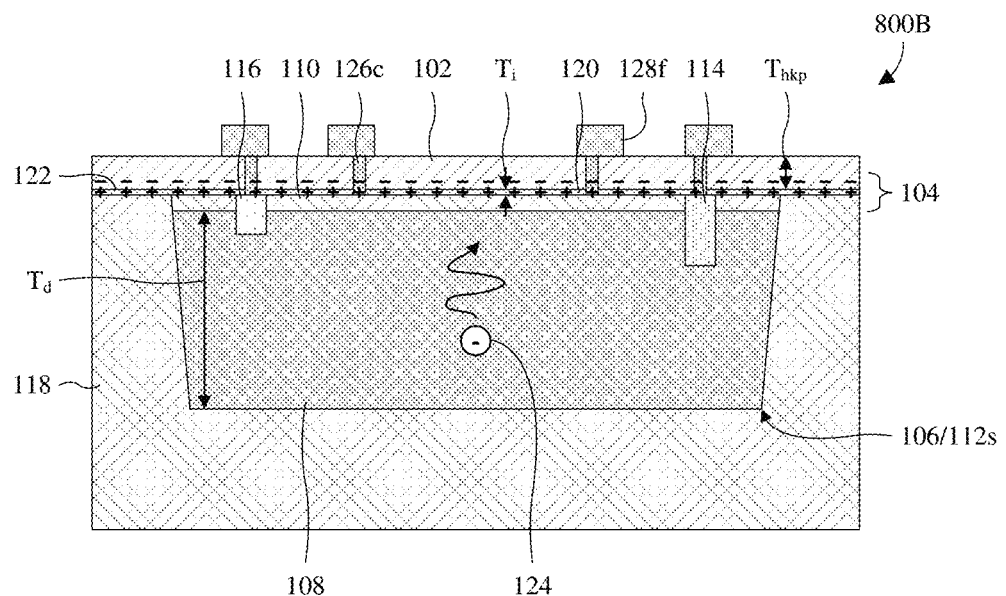

With reference to FIGS. 8A and 8B, various cross-sectional views 800A, 800B of some alternative embodiments of the image sensor of FIGS. 1A and 1B are provided in which the photodetector 106 is varied.

As illustrated by the cross-sectional view 800A of FIG. 8A, a bottom surface of the cap layer 110 is elevated above a top surface of the substrate 118, such that a top of the photodetector 106 is elevated above the top surface of the substrate 118. In alternative embodiments, the bottom surface of the cap layer 110 is recessed relative to the top surface of the substrate 118 and a top surface of the cap layer 110 is elevated above the top surface of the substrate 118.

As illustrated by the cross-sectional view 800B of FIG. 8B, the photodetector 106 comprises a single PIN diode 112s instead of a pair of PIN diodes 112. The single PIN diode 112s is as the PIN diodes 112 of FIGS. 1A and 1B are described and hence comprises a P-type contact region 114 and an N-type contact region 116. The P-type and N-type contact regions 114, 116 are respectively on opposite sides of the device layer 108.

Figure 9:
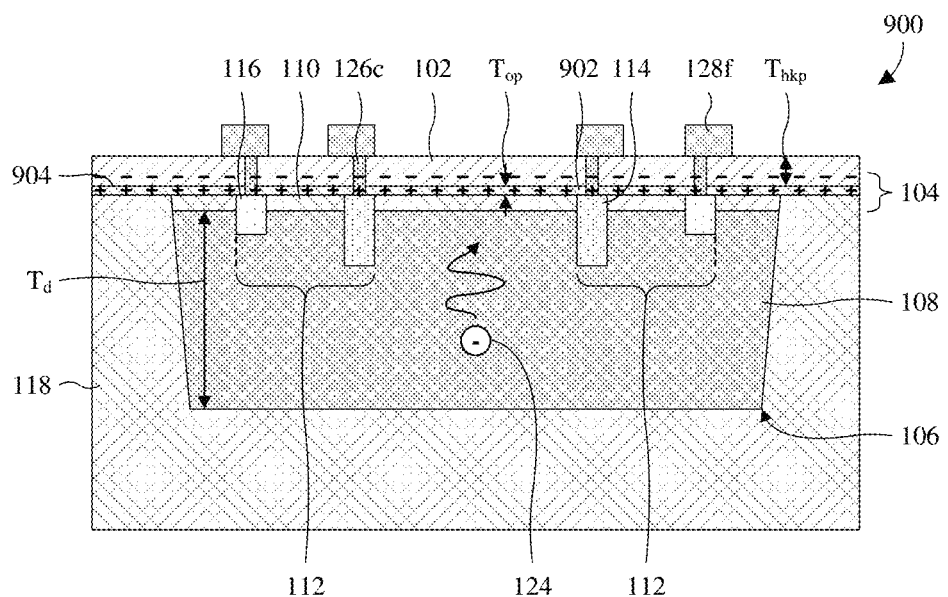
FIG. 9 illustrates a cross-sectional view of some alternative embodiments of the image sensor of FIGS. 1A and 1B in which an interfacial layer is replaced with an oxide passivation layer.

With reference to FIG. 9, a cross-sectional view 900 of some alternative embodiments of the image sensor of FIGS. 1A and 1B is provided in which the interfacial layer 120 is replaced with an oxide passivation layer 902. The oxide passivation layer 902 is similar to the interfacial layer 120. However, in contrast with the interfacial layer 120, the oxide passivation layer 902 is deposited during formation of the image sensor. As such, the oxide passivation layer 902 is not formed because of a reaction between the high k passivation layer 102 and the cap layer 110. Because the oxide passivation layer 902 is formed by deposition, the oxide passivation layer 902 has a higher crystalline quality than the interfacial layer 120, which leads to reduced leakage current and enhanced performance of the photodetector 106.

The oxide passivation layer 902 is a dielectric having a different band gap than the high k passivation layer 102 and a smaller areal oxygen density than that of the high k passivation layer 102. Because of the different band gaps, band bending occurs at an interface 904 between the oxide passivation layer 902 and the high k passivation layer 102. The band bending, in turn, induces formation of the dipole moment 104 at the interface 904. Because the oxide passivation layer 902 has a smaller areal oxygen density than that of the high k passivation layer 102, negative charge (schematically illustrated by minus signs) accumulates in the high k passivation layer 102 along the interface 904, whereas positive charge (schematically illustrated by plus signs) accumulates in the oxide passivation layer 902 along the interface 904. In alternative embodiments, the oxide passivation layer 902 has a higher areal oxygen density than that of the high k passivation layer 102 to reverse a polarity of the dipole moment 104.

The oxide passivation layer 902 has a lower dielectric constant than the high k passivation layer 102 and, in some embodiments, has a larger bandgap than that of the high k passivation layer 102. In some embodiments, the oxide passivation layer 902 comprises a semiconductor element from the substrate 118 and further comprises oxygen and/or some other suitable element(s) from the high k passivation layer 102. In some embodiments, the oxide passivation layer 902 is or comprise silicon dioxide (e.g., $SiO_2$) and/or some other suitable dielectric(s).

In some embodiments, the oxide passivation layer 902 has a thickness $T_{op}$ of about 1-nanometers, about 1-5 nanometers, about 5-10 nanometers, or some other suitable value. If the oxide passivation layer 902 is too thin (e.g., less than about 1 nanometers or some other suitable value), the oxide passivation layer 902 may be too thin to meaningfully reduce leakage current compared to FIGS. 1A and 1B. If the thickness $T_{op}$ is too large (e.g., more than about 10 nanometers or some other suitable value), the dipole moment 104 may be too far from mobile electrons 124 of dark current to meaningfully attract and neutralize the mobile electrons 124. As a result, the dipole moment 104 may fail to meaningfully improve the accuracy of measurements by the PIN diodes 112 and may hence fail to meaningful improve distance determinations.

Figure 10A:
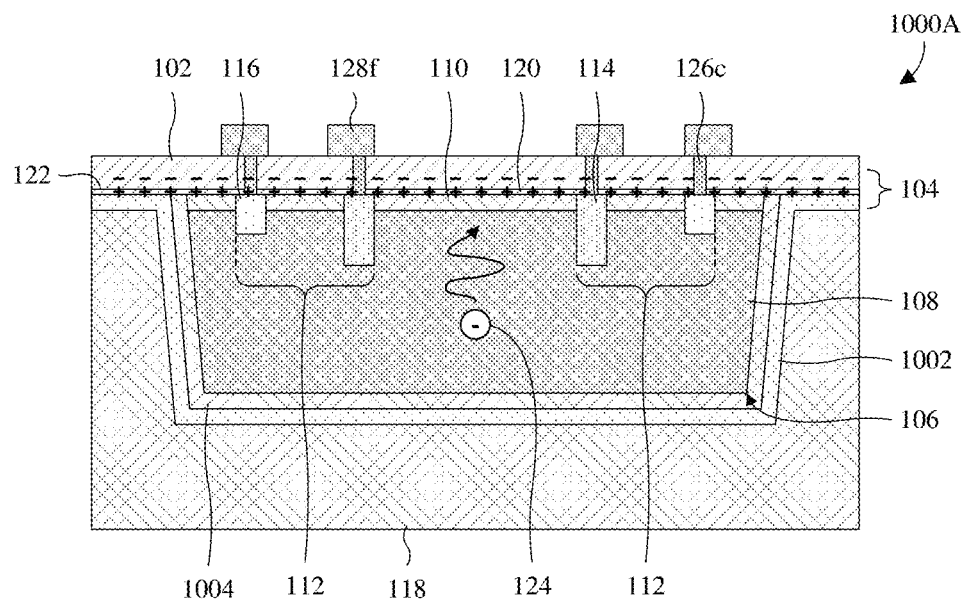
FIGS. 10A and 10B illustrate cross-sectional views of some alternative embodiments of the image sensor of FIGS. 1A and 1B in which a device layer is lined by a substrate implant region and an interlayer.
Figure 10B:
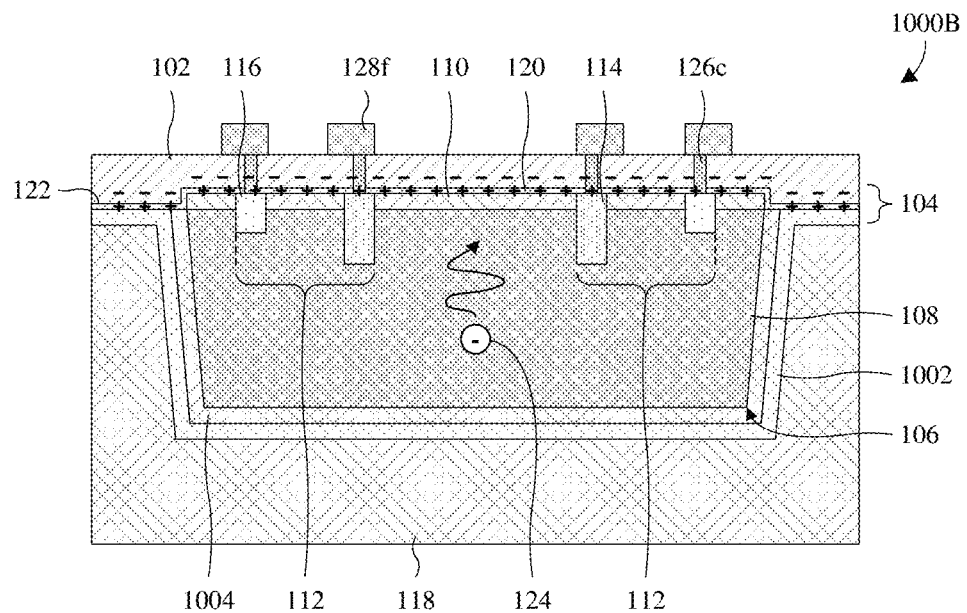

With reference to FIGS. 10A and 10B, cross-sectional views 1000A, 1000B of some alternative embodiments of the image sensor of FIGS. 1A and 1B are provided in which the device layer 108 is lined by a substrate implant region 1002 and an interlayer 1004. In FIG. 10A, a top surface of the cap layer 110 is about level with that of the substrate 118 (note that the substrate implant region 1002 is a doped region of the substrate 118). In Fig. FIG. 10B, a bottom surface of the cap layer 110 is elevated above a top surface of the substrate 118. In alternative embodiments, the bottom surface of the cap layer 110 is recessed relative to the top surface of the substrate 118 and the top surface of the cap layer 110 is elevated above the top surface of the substrate 118.

As noted above, the substrate implant region 1002 is a doped region of the substrate 118. Further, the substrate implant region 1002 has the same doping type as, but a higher doping concentration than, a bulk of the substrate 118. For example, the substrate implant region 1002 and the bulk of the substrate 118 may both be P-type or N-type. In some embodiments, a doping concentration of the substrate implant region 1002 is about $1 \times 10^{17}$-$5 \times 10^{18}$ cm$^{-3}$, is greater than about $5 \times 10^{18}$ cm$^{-3}$, or is some other suitable value.

The interlayer 1004 separates the device layer 108 from the substrate implant region 1002. The interlayer 1004 is an undoped semiconductor material different than that of the device layer 108. In alternative embodiments, the interlayer 1004 is a lightly doped semiconductor material that is different than that of the device layer 108 and/or that has a lesser doping concentration than the substrate implant region 1002. The light doping may, for example, be a doping concentration less than about $1 \times 10^{15}$ cm$^{-3}$ or some other suitable value. The interlayer 1004 may, for example, be or comprise silicon and/or some other suitable semiconductor material. In some embodiments, the interlayer 1004 is or comprises the same semiconductor material as the substrate 118 and/or the cap layer 110. For example, the interlayer 1004, the substrate 118, and the cap layer 110 may be silicon, whereas the device layer 108 may be germanium or silicon germanium. Other suitable materials are, however, amenable.

The substrate implant region 1002 reduces carriers induced by crystalline defects at an interface between the interlayer 1004 and the substrate 118 and/or at an interface between the interlayer 1004 and the device layer 108. As a result, leakage current at the first and/or second interface(s) may be reduced and performance of the photodetector 106 may be increased.

Because the interlayer 1004 is undoped, the interlayer 1004 has a high resistance. This high resistance reduces leakage current from the device layer 108 to the substrate 118. By reducing leakage current from the device layer 108 to the substrate 118, inter-photodetector leakage current is reduced and performance of the photodetector 106 is further increased. The high resistance may, for example, be greater than about 100 kiloohms or some other suitable value. The interlayer 1004 further blocks dopants from the substrate implant region 1002 from diffusing to the device layer 108. For example, the substrate implant region 1002 may have a P-type doping and the interlayer 1004 may block boron or other suitable P-type dopants from diffusing to the device layer 108. Dopants that diffuse to the device layer 108 may create a low resistance region from the substrate 118 to the device layer 108 and may hence increases inter-photodetector leakage current. Because the interlayer 1004 blocks the diffusion, the resistance from the substrate 118 to the device layer 108 may remain high and leakage current may remain low.

Figure 11:
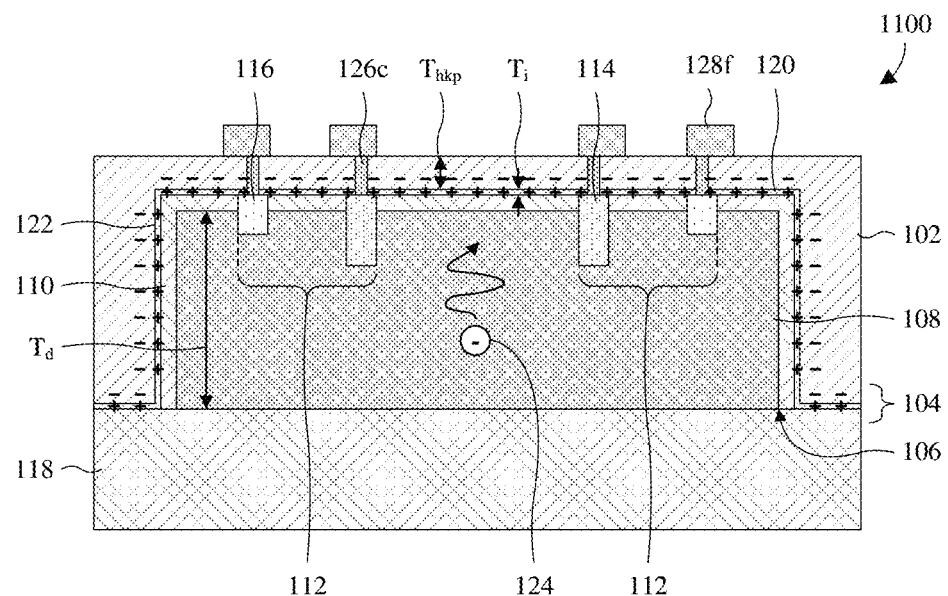
FIG. 11 illustrates a cross-sectional view of some alternative embodiments of the image sensor of FIGS. 1A and 1B in which a bottom surface of a device layer is elevated above a top surface of a substrate.

With reference to FIG. 11, a cross-sectional view 1100 of some alternative embodiments of the image sensor of FIGS. 1A and 1B is provided in which a bottom surface of the device layer 108 is elevated above a top surface of the substrate 118. Further, the cap layer 110 is on sidewalls of the device layer 108, the interfacial layer 120 is on sidewalls of the cap layer 110, and the high k passivation layer 102 is on sidewalls of the interfacial layer 120. Because the bottom surface of the device layer 108 is elevated above the top surface of the substrate 118, the device layer 108 and the cap layer 110 may be regarded as defining a mesa structure over the substrate 118. Further, inter-photodetector isolation is enhanced because the photodetector 106 is laterally separated from photodetectors by the high k passivation layer 102.

Figure 12A:
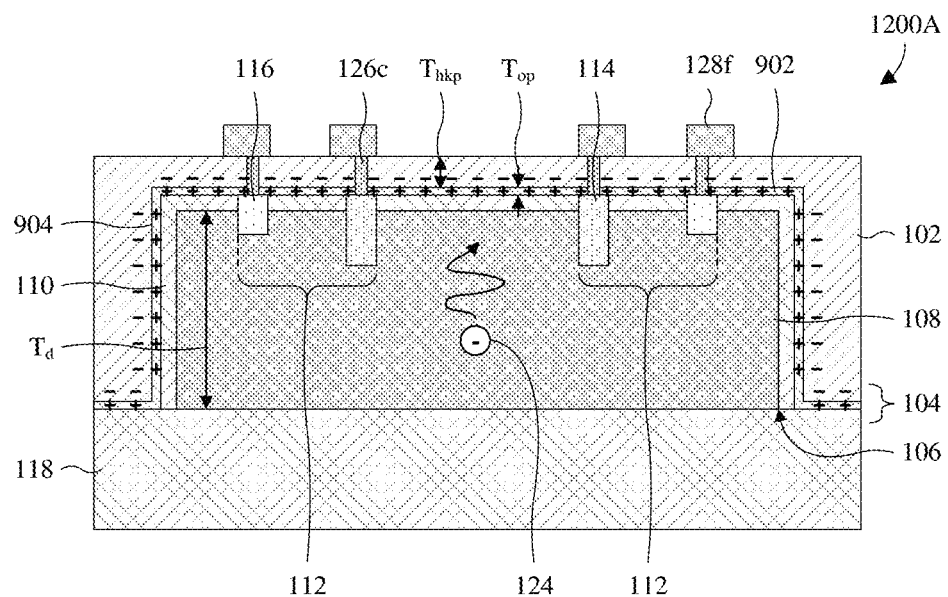
FIGS. 12A-12C illustrate cross-sectional views of some alternative embodiments of the image sensor of FIG. 11.
Figure 12B:
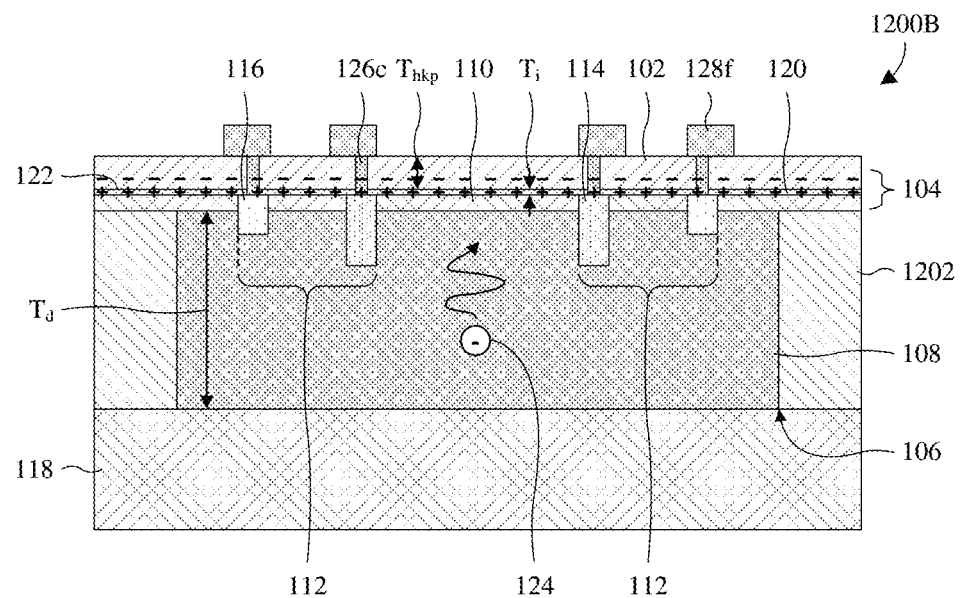
Figure 12C:
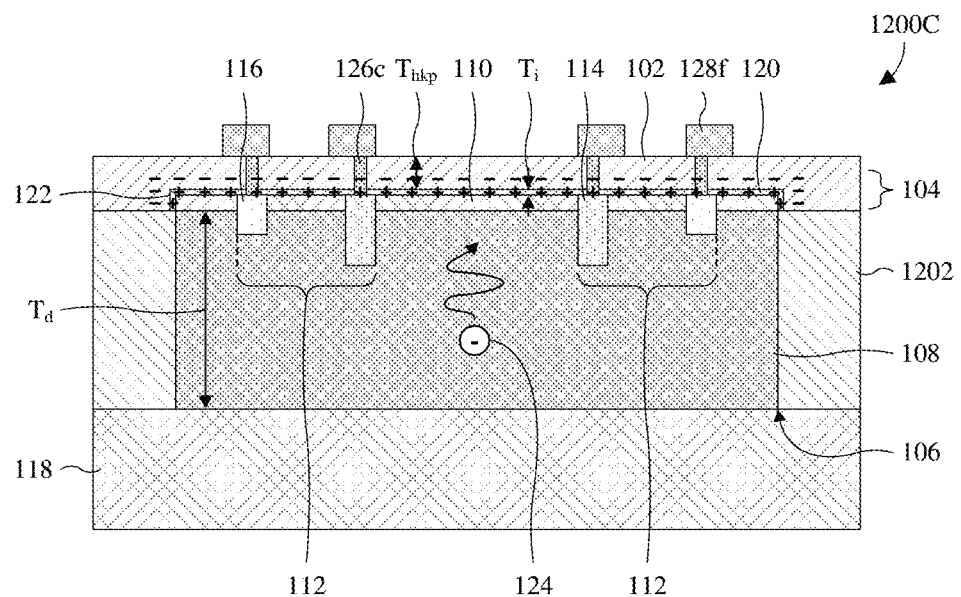

With reference to FIGS. 12A-12C, various cross-sectional views 1200A-1200C of some alternative embodiments of the image sensor of FIG. 11 is provided.

As illustrated by the cross-sectional view 1200A of FIG. 12A, the interfacial layer 120 is replaced with the oxide passivation layer 902 of FIG. 9. As described with regard to FIG. 9, the oxide passivation layer 902 is similar to the interfacial layer 120. However, the oxide passivation layer 902 is deposited during formation of the image sensor instead of being formed by a reaction between the high k passivation layer 102 and the cap layer 110. Because the oxide passivation layer 902 is formed by deposition, the oxide passivation layer 902 has a higher crystalline quality than the interfacial layer 120, which leads to reduced leakage current.

As illustrated by the cross-sectional views 1200B, 1200C of FIGS. 12B and 12C, an inter-photodetector dielectric layer 1202 separates the photodetector 106 from neighboring photodetectors. In FIG. 12B, the cap layer 110, the interfacial layer 120, and the high k passivation layer 102 are vertically stacked and overlie the inter-photodetector dielectric layer 1202 and the device layer 108. In FIG. 12C, the cap layer 110 is localized to the device layer 108. As such, the interfacial layer 120 is on sidewalls of the cap layer 110 and the high k passivation layer 102 is on sidewalls of the interfacial layer 120. The inter-photodetector dielectric layer 1202 may, for example, be or comprise silicon oxide and/or some other suitable dielectric(s).

Figure 13:
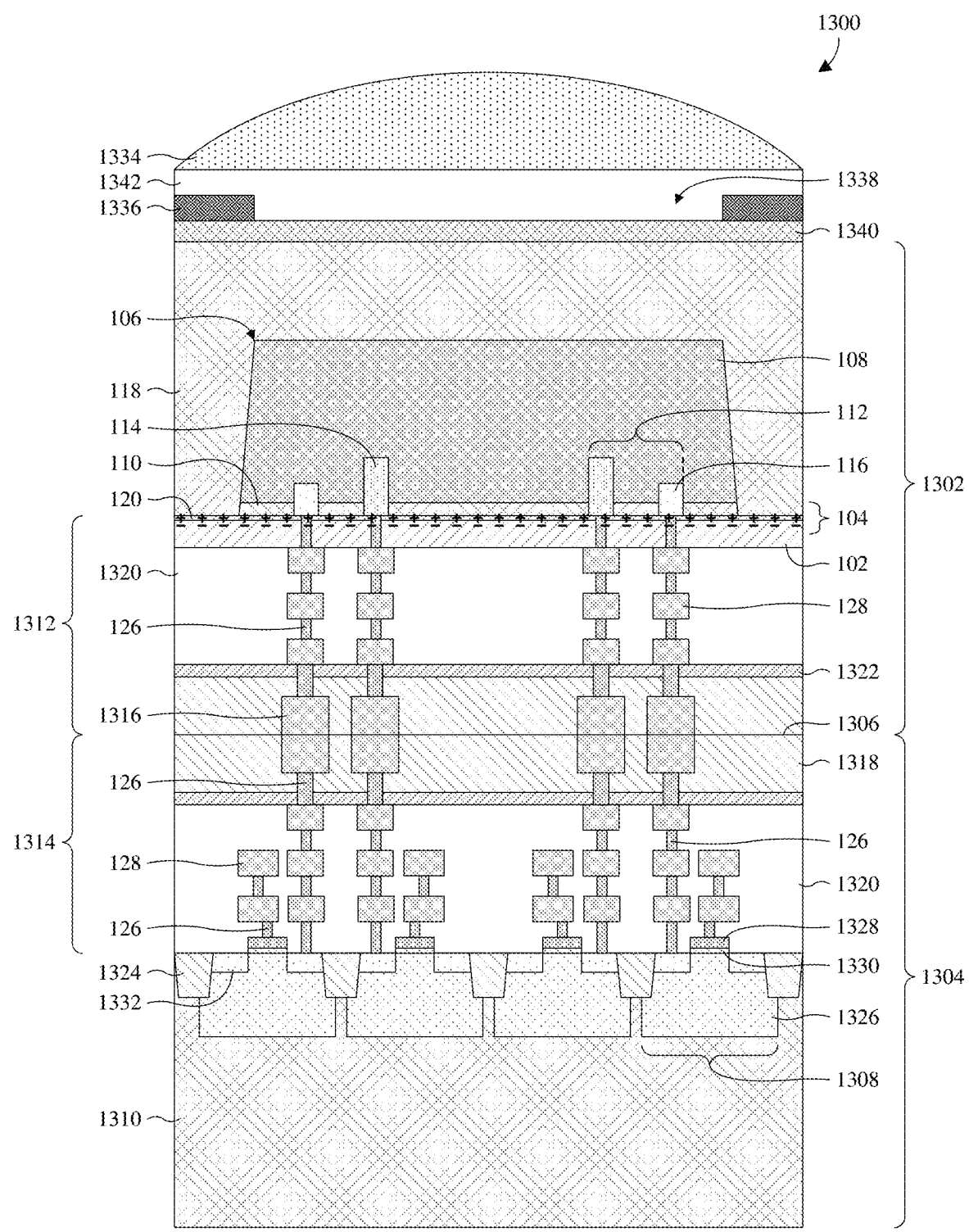
FIG. 13 illustrates an expanded cross-sectional view of some embodiments of the image sensor of FIGS. 1A and 1B in which the image sensor is backside illuminated (BSI) and is a three-dimensional (3D) integrated circuit (IC).

With reference to FIG. 13, an expanded cross-sectional view 1300 of some embodiments of the image sensor of FIGS. 1A and 1B is provided in which the image sensor is backside illuminated (BSI) and is a three-dimensional (3D) integrated circuit (IC). The 3D IC comprises a first IC structure 1302 and a second IC structure 1304 hybrid bonded together at a bond interface 1306. The first IC structure 1302 overlies the second IC structure 1304 and accommodates the photodetector 106, whereas the second IC structure 1304 underlies the first IC structure 1302 and accommodates a plurality of logic devices 1308.

The first and second IC structures 1302, 1304 respectively comprise a first substrate 118 and a second substrate 1310. Further, the first and second IC structures 1302, 1304 respectively comprise a first interconnect structure 1312 and a second interconnect structure 1314. The first and second interconnect structures 1312, 1314 are between and respectively border the first and second substrates 118, 1310. The photodetector 106 is on a frontside of the first substrate 118, between the first substrate 118 and the first interconnect structure 1312. The logic devices 1308 are on a frontside of the second substrate 1310, between the second substrate 1310 and the second interconnect structure 1314. The first and second substrates 118, 1310 may, for example, be bulk substrates of monocrystalline silicon or some other suitable type of substrate.

The first and second interconnect structures 1312, 1314 comprise a plurality of wires 128, a plurality of vias 126, and a plurality of pads 1316 grouped into levels and alternatingly stacked between the first and second substrates 118, 1310. The levels correspond to different elevations above the second substrate 1310. The pads 1316 are grouped into two pad levels that directly contact at the bond interface 1306. The wires 128 and the vias 126 are grouped respectively into multiple wire levels and via levels that are alternatingly stacked from the pads 1316 respectively to the photodetector 106 and the logic devices 1308. The wires 128, the vias 126, and the pads 1316 are conductive and may be or comprise copper, tungsten, aluminum, some other suitable conductive material(s), or any combination of the foregoing.

A dielectric stack surrounds the wires 128, the vias 126, and the pads 1316 between the first and second substrates 118, 1310. A pair of bond dielectric layers 1318 directly contact at the bond interface 1306 and surround the pads 1316 and the vias 126 at the pads 1316. The etch stop layers 1322 respectively border the bond dielectric layers 1318 and further surround the vias 126 at the pads 1316. The high k passivation layer 102 and the interfacial layer 120 surround the vias 126 at the photodetector 106. A pair of interconnect dielectric layers 1320 surround the wires 128 and a remainder of the vias 126. The etch stop layers 1322 are or comprise a different material than the interconnect dielectric layers 1320 and the bond dielectric layers 1318.

A trench isolation structure 1324 separates the logic devices 1308. The trench isolation structure 1324 is or comprises silicon oxide and/or some other suitable dielectric(s). The trench isolation structure 1324 may, for example, be a shallow trench isolation (STI) structure or some other suitable type of trench isolation structure.

The logic devices 1308 are insulated-gate field-effect transistors (IGFETs) but may be some other suitable type of transistor. For example, the logic devices 1308 may be fin field-effect transistors (finFETs), gate-all-around field-effect transistors (GAAFETs), or some other suitable type of transistors. The logic devices 1308 comprise individual wells 1326, individual gate electrodes 1328, individual gate dielectric layers 1330, and individual pairs 1332 of source/drain regions. The gate electrodes 1328 are respectively stacked with the gate dielectric layers 1330 on the second substrate 1310, and the stacks are between the source/drain regions of the respective pairs 1332 of source/drain regions. The wells 1326 respectively underlie and surround the pairs 1332 of source/drain regions in the second substrate 1310. The wells 1326 have an opposite doping type as the respective pairs 1332 of source/drain regions. In some embodiments, one, some, or all of the wells 1326 has/have an opposite doping type as a bulk of the second substrate 1310. In some embodiments, one, some, or all of the wells 1326 has/have a same doping type, but a different doping concentration, than the bulk of the second substrate 1310. In alternative embodiments, one, some, or all of the wells 1326 is/are omitted.

A micro lens 1334 and a metal grid 1336 are stacked over the first substrate 118 on a backside of the first substrate 118. The metal grid 1336 has a metal-grid opening 1338 overlying the photodetector 106 and is configured to prevent crosstalk between the photodetector 106 and neighboring photodetectors. Further, the metal grid 1336 is surrounded by an antireflective layer 1340 and a metal-grid dielectric layer 1342. The antireflective layer 1340 is between the metal grid 1336 and the first substrate 118 to separate the metal grid 1336 from the first substrate 118, and the metal-grid dielectric layer 1342 fills the metal-grid opening 1338 and separates the metal grid 1336 from the micro lens 1334. The micro lens 1334 overlies the metal grid 1336 and is configured to focus incident radiation on the photodetector 106 through the metal-grid opening 1338.

Figure 14:
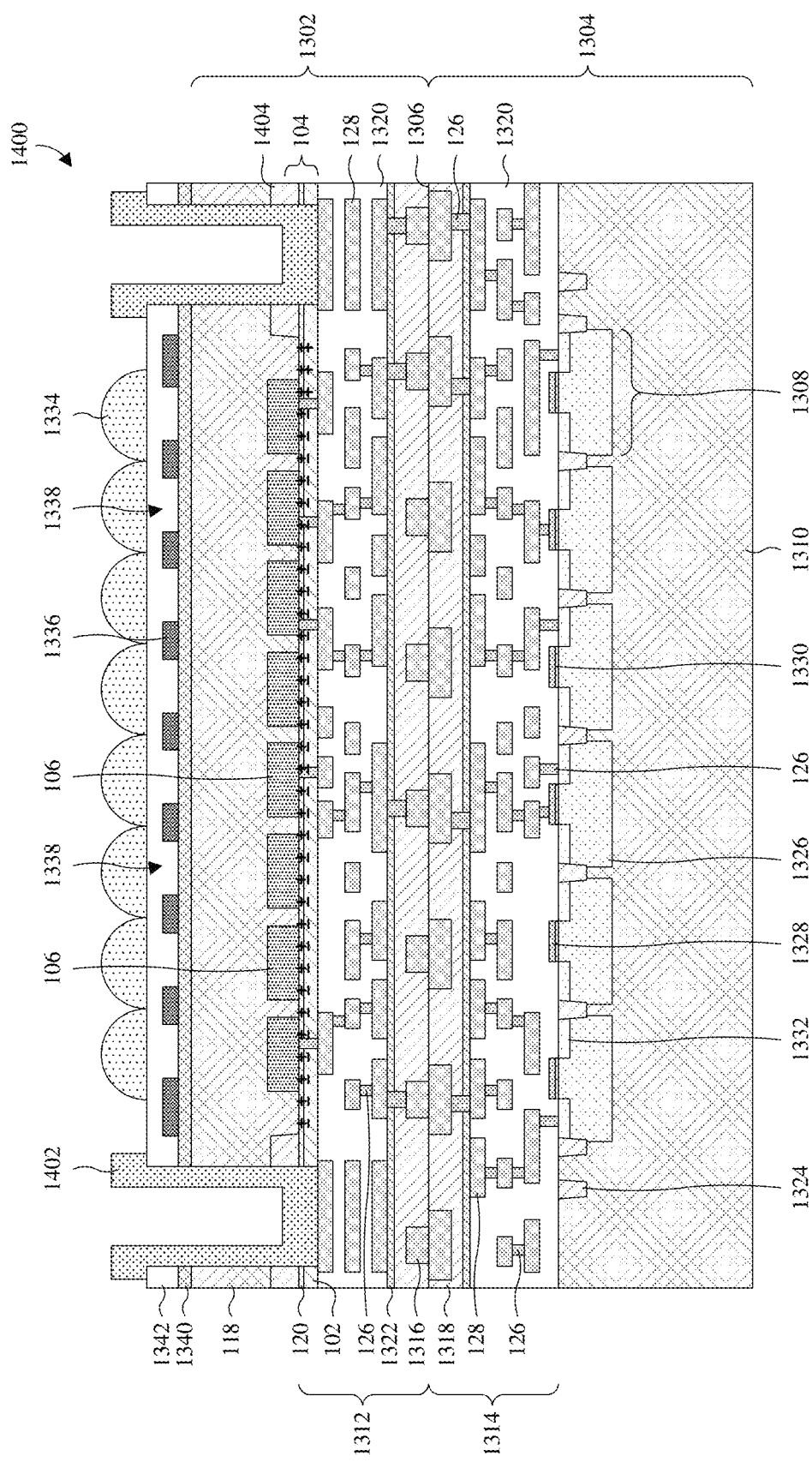
FIG. 14 illustrates a cross-sectional view of some alternative embodiments of the image sensor of FIG. 13 in which the image sensor has multiple photodetectors.

With reference to FIG. 14, a cross-sectional view 1400 of some alternative embodiments of the image sensor of FIG. 13 is provided in which the image sensor has multiple photodetectors 106. The photodetectors 106 are each as their counterpart in FIG. 13. In alternative embodiments, the photodetectors 106 are each as their counterpart in any of the above described figures (e.g., FIG. 10 or some other suitable figure). Note that due to the small sizes of the photodetectors 106 in FIG. 14, constituents of the photodetectors 106 (e.g., contact regions) are not shown.

A plurality of micro lenses 1334 overlie the photodetectors 106, and the metal grid 1336 defines a plurality of metal-grid openings 1338. The micro lenses 1334 are individual to and respectively overlie the photodetectors 106. Similarly, the metal-grid openings 1338 are individual to and respectively overlie the photodetectors 106. The micro lenses 1334 and the metal-grid openings 1338 are respectively as their counterparts in FIG. 13 are described.

A pair of bond pads 1402 overhang the metal-grid dielectric layer 1342 and extend through the first substrate 118 respectively to some of the wires 128. Further, the bond pads 1402 are respectively on opposite sides of the photodetectors 106, such that the photodetectors 106 are between the bond pads 1402. The bond pads 1402 may, for example, be or comprise copper, aluminum, some other suitable metal(s), or any combination of the foregoing.

An additional trench isolation structure 1404 extends into the frontside of the first substrate 118, between the first substrate 118 and the first interconnect structure 1312. The additional trench isolation structure 1404 has multiple segments individual to and respectively at the bond pads 1402, such that the bond pads 1402 extend through the additional trench isolation structure 1404. The additional trench isolation structure 1404 is or comprises silicon oxide and/or some other suitable dielectric(s). The additional trench isolation structure 1404 may, for example, be a STI structure or some other suitable type of trench isolation structure.

Figure 15:
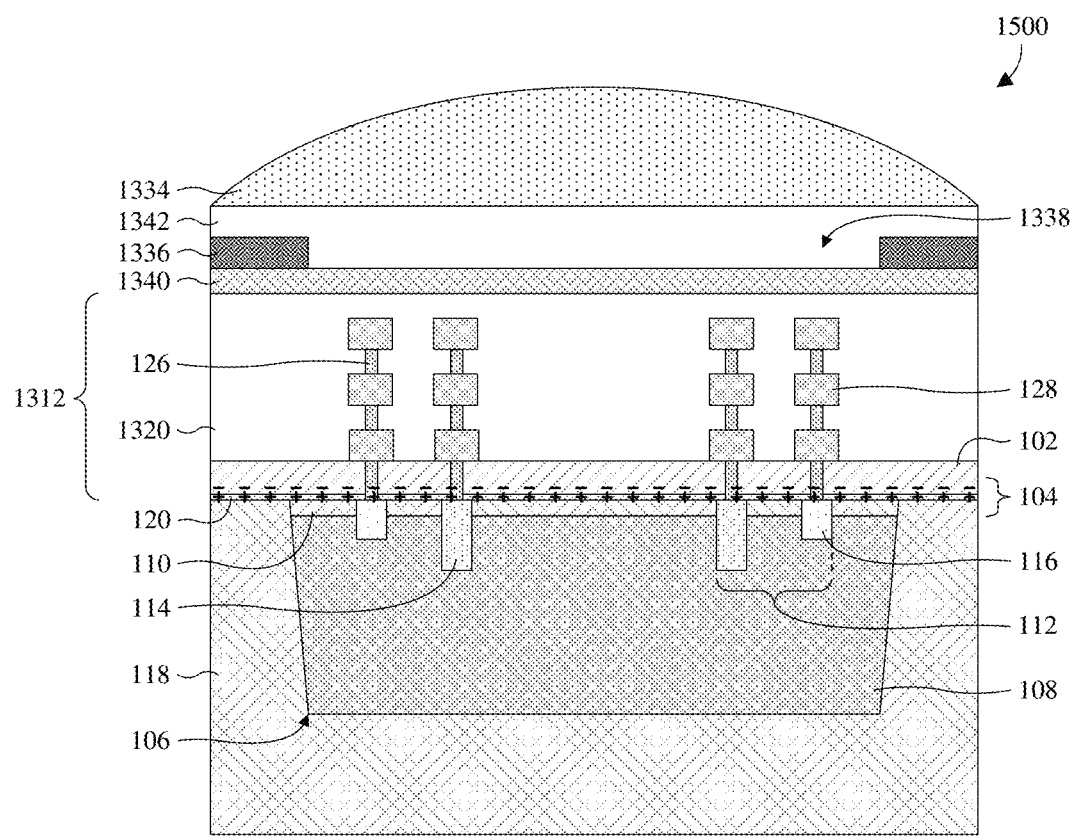
FIG. 15 illustrates an expanded cross-sectional view of some embodiments of the image sensor of FIGS. 1A and 1B in which the image sensor is frontside illuminated (FSI).

With reference to FIG. 15, an expanded cross-sectional view 1500 of some embodiments of the image sensor of FIGS. 1A and 1B is provided in which the image sensor is frontside illuminated (FSI). An interconnect structure 1312 overlies the substrate 118 and the photodetector 106 on a frontside of the substrate 118. Further, the interconnect structure 1312 overlies logic devices (not shown) on the frontside of the substrate 118. The logic devices may, for example, be as the logic devices 1308 of FIG. 13 are illustrated and described. The interconnect structure 1312 comprises a plurality of wires 128 and a plurality of vias 126. The wires 128 and the vias 126 are alternatingly stacked in a dielectric stack. The high k passivation layer 102 and the interfacial layer 120 surround the vias 126 at the photodetectors 106. An interconnect dielectric layer 1320 surround the wires 128 and a remainder of the vias 126.

A micro lens 1334 and a metal grid 1336 are stacked over the interconnect structure 1312 on the frontside of the substrate 118. Further, an antireflective layer 1340 is between the metal grid 1336 and the interconnect structure 1312, whereas the metal-grid dielectric layer 1342 fills the metal-grid opening 1338 and separates the metal grid 1336 from the micro lens 1334. The micro lens 1334 and the metal grid are as described with regard to FIG. 13.

Figure 16:
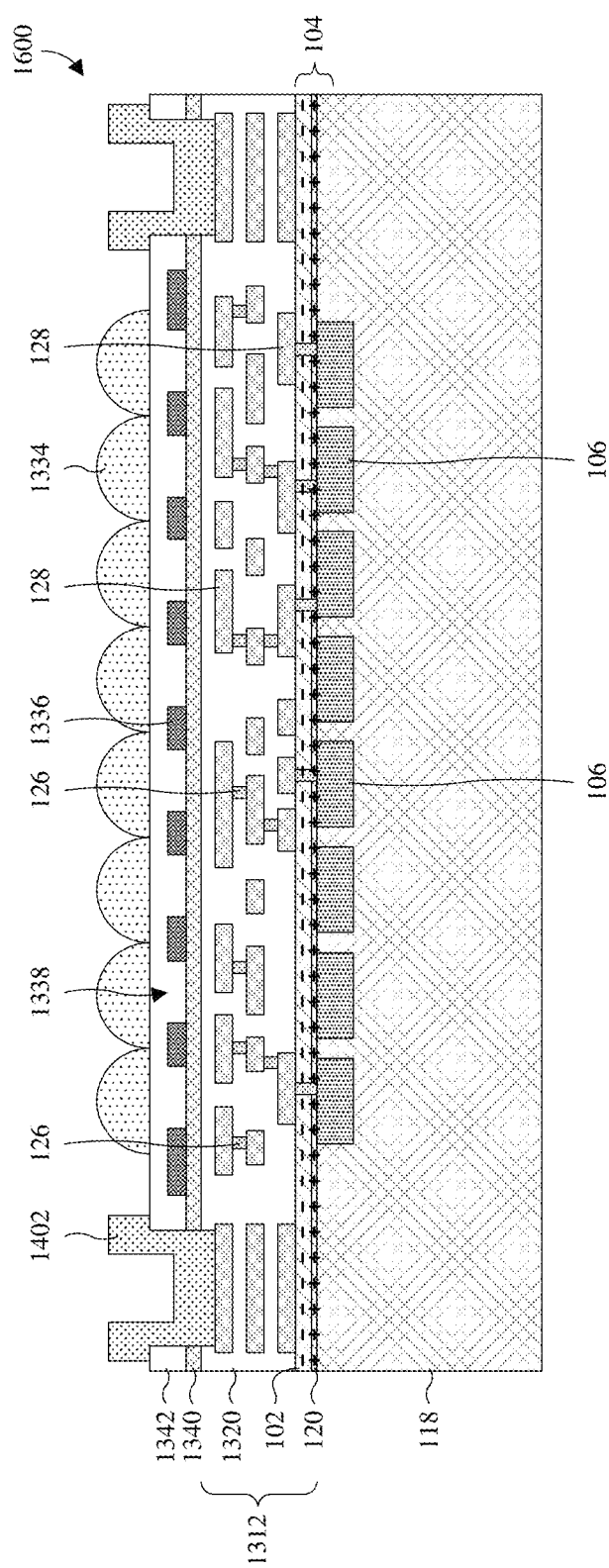
FIG. 16 illustrates a cross-sectional view of some alternative embodiments of the image sensor of FIG. 15 in which the image sensor has multiple photodetectors.

With reference to FIG. 16, a cross-sectional view 1600 of some alternative embodiments of the image sensor of FIG. 15 is provided in which the image sensor has multiple photodetectors 106. The photodetectors 106 are each as their counterpart in FIG. 15. In alternative embodiments, the photodetectors 106 are each as their counterpart in any of the above described figures (e.g., FIG. 10 or some other suitable figure). Note that due to the small sizes of the photodetectors 106 in FIG. 15, constituents of the photodetectors 106 (e.g., contact regions) are not shown.

A plurality of micro lenses 1334 overlie the photodetectors 106, and the metal grid 1336 defines a plurality of metal-grid openings 1338. The micro lenses 1334 are individual to and respectively overlie the photodetectors 106. Similarly, the metal-grid openings 1338 are individual to and respectively overlie the photodetectors 106. Additionally, a pair of bond pads 1402 overhang the metal-grid dielectric layer 1342 on the frontside of the substrate 118 and extend through the antireflective layer 1340 and the metal-grid dielectric layer 1342 respectively to some of the wires 128. Further, the bond pads 1402 are respectively on opposite sides of the photodetectors 106, such that the photodetectors 106 are between the bond pads 1402.

Figure 22:
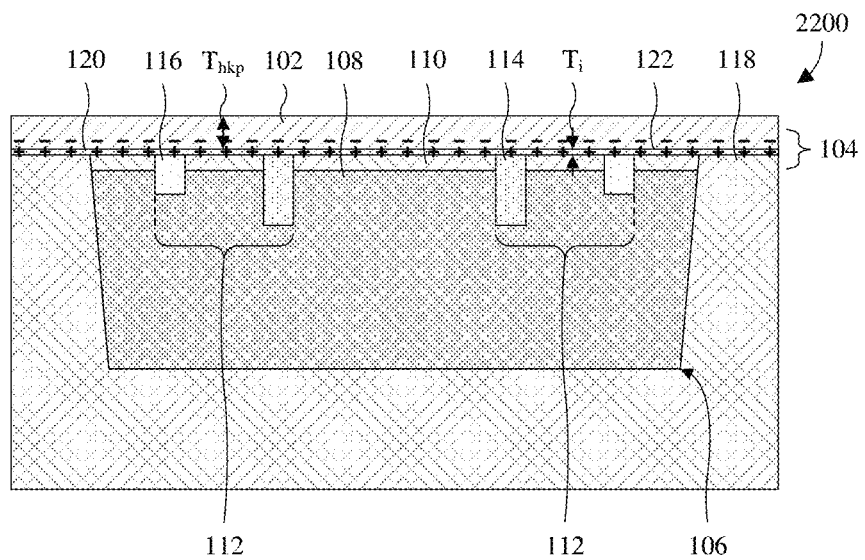
Figure 23A:
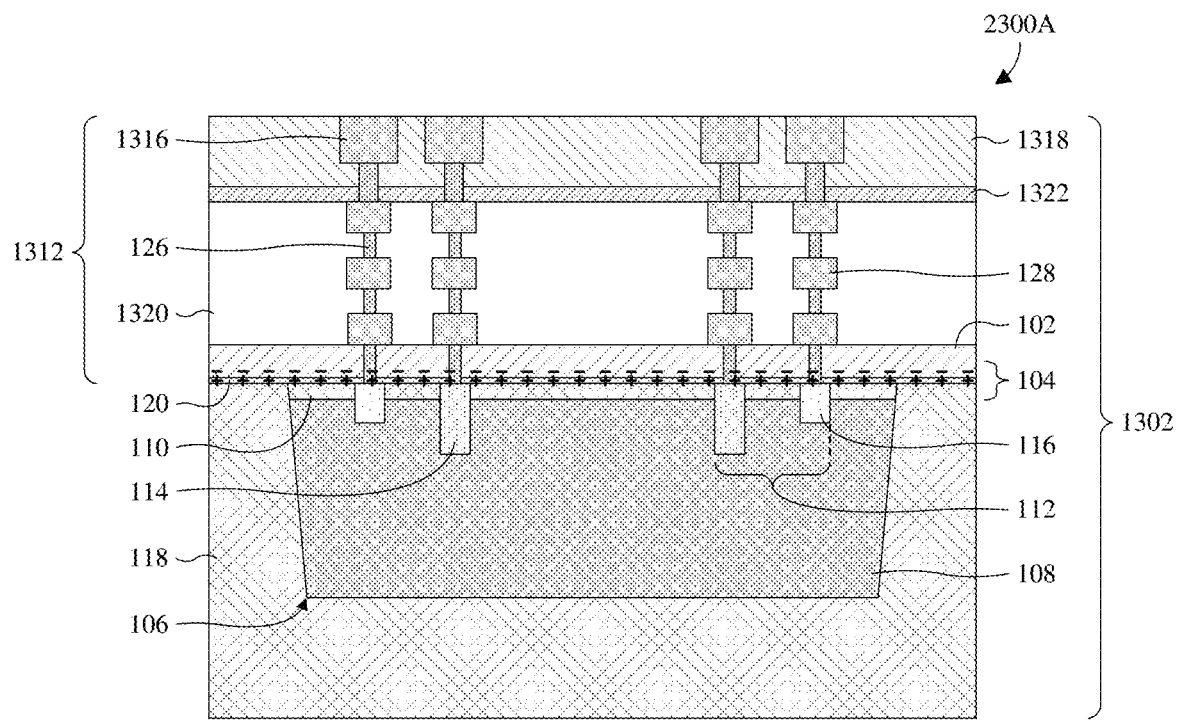
Figure 23B:
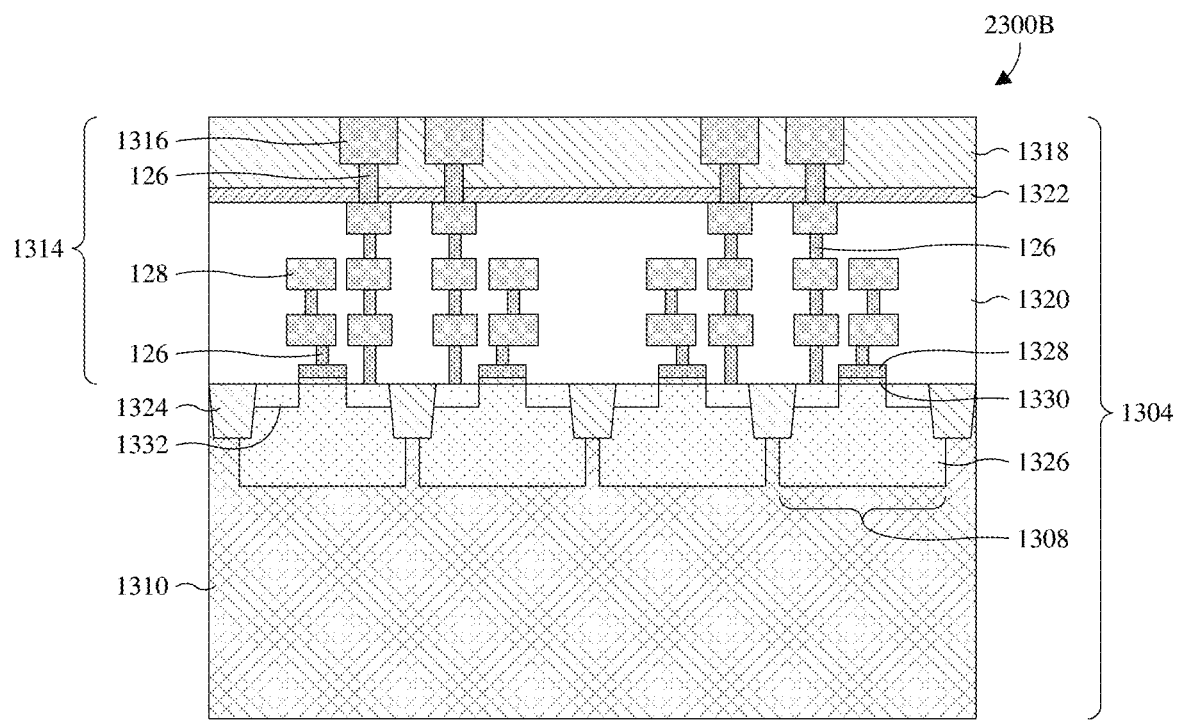
Figure 23C:
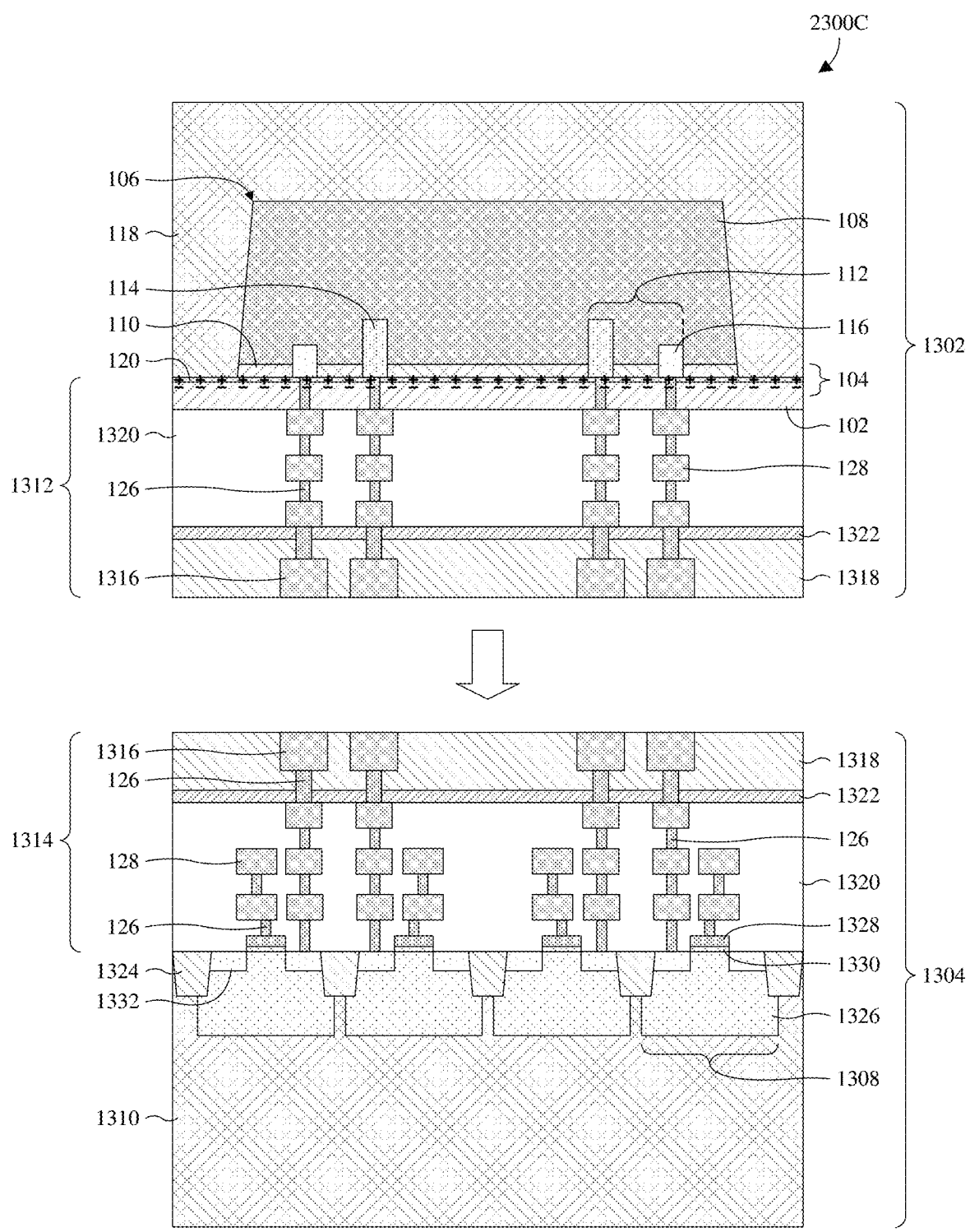
Figure 23D:
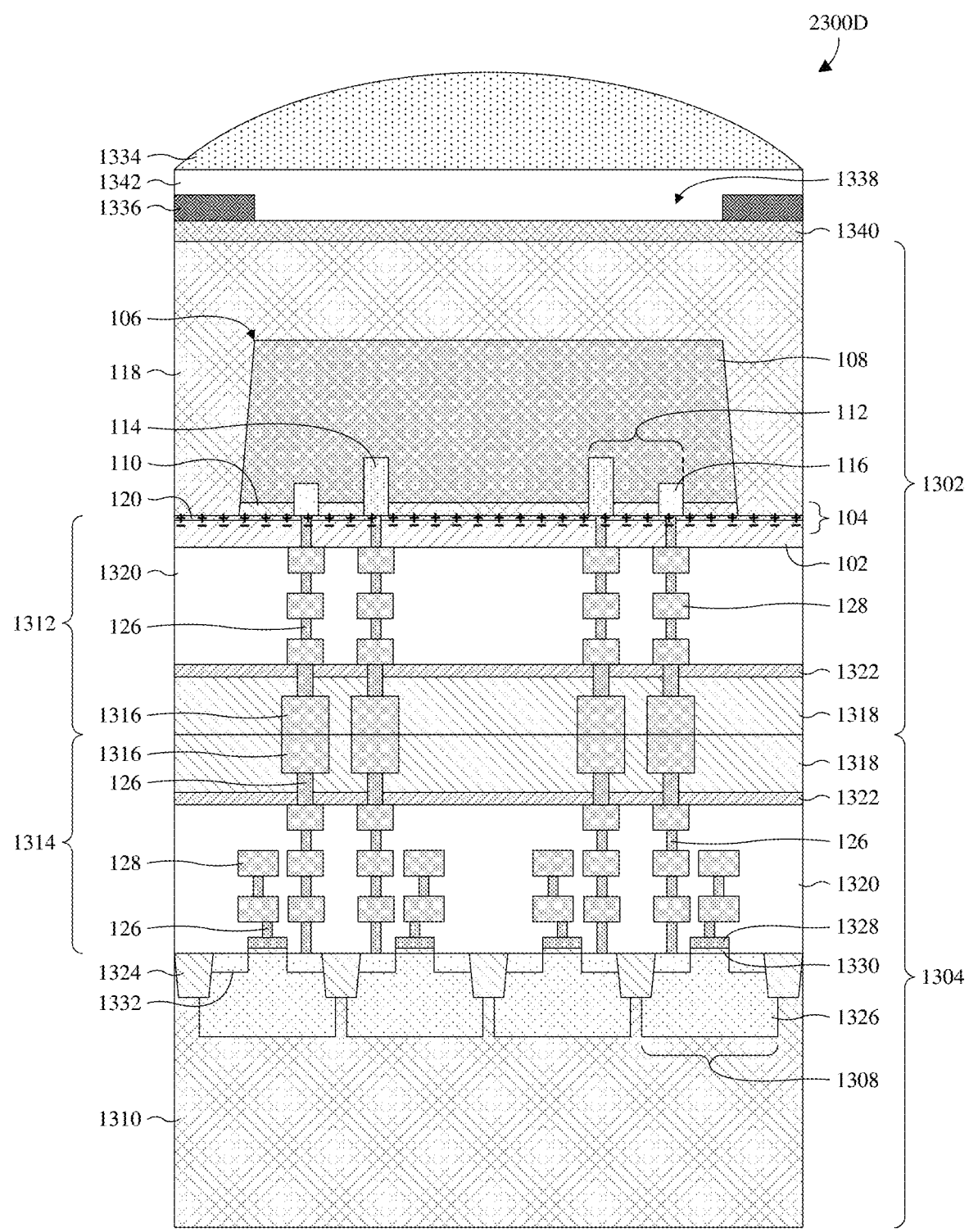
Figure 24A:
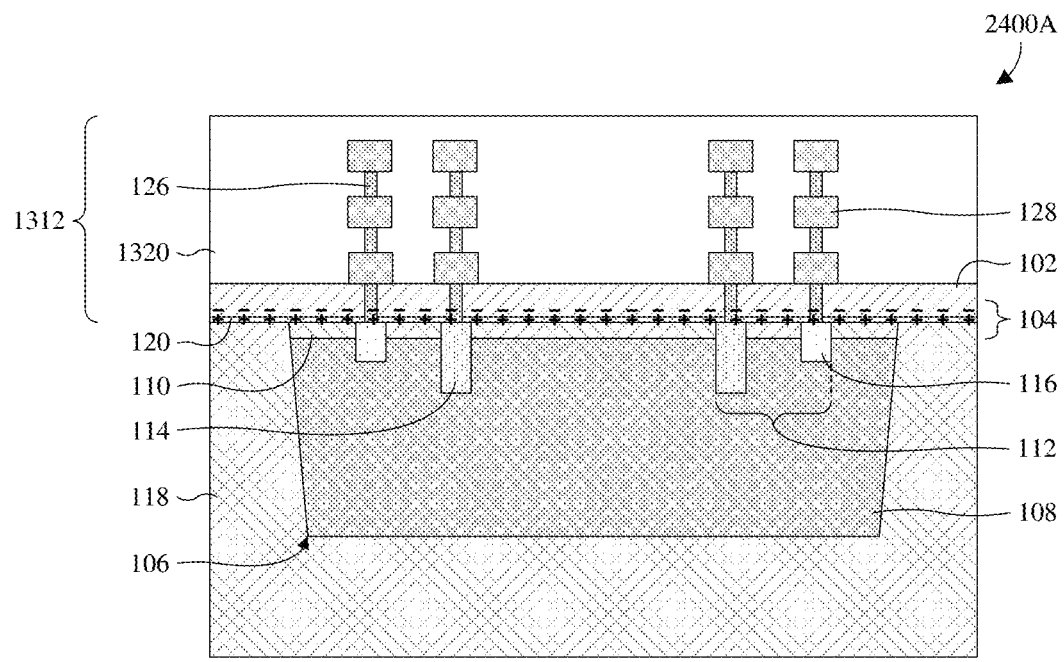
Figure 24B:
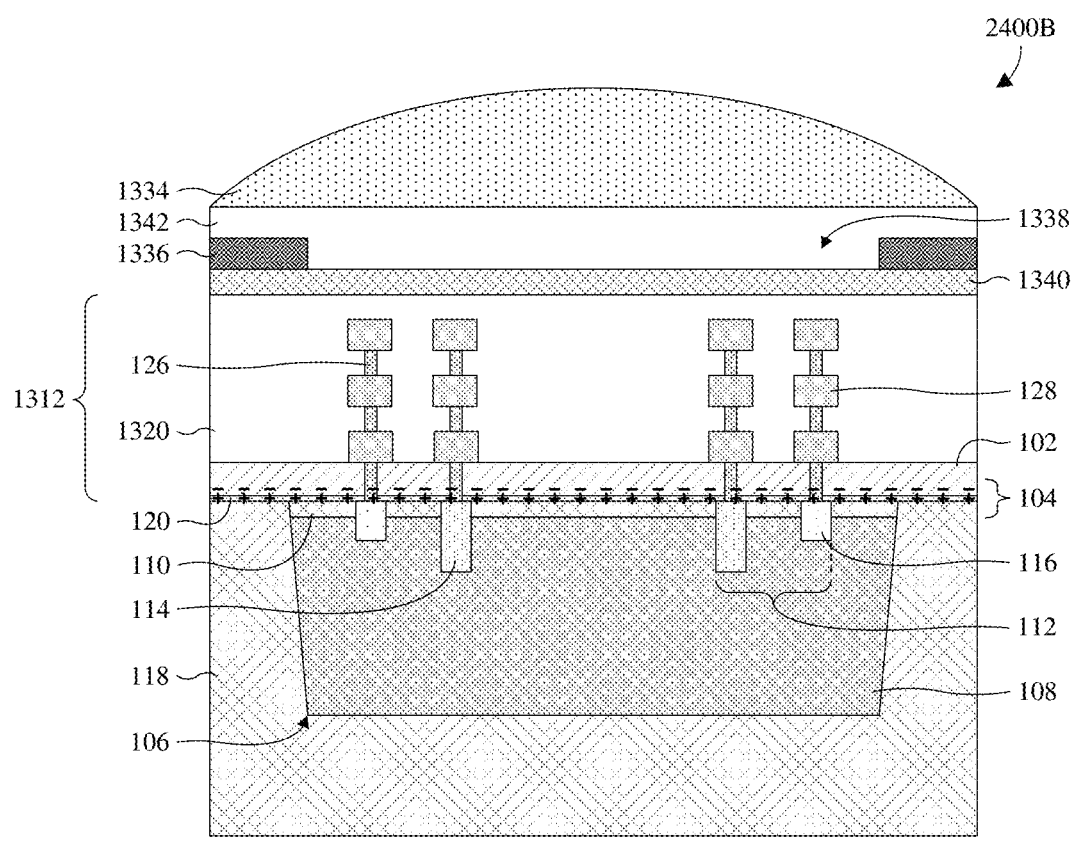

With reference to FIGS. 17-22, 23A-23D, 24A, and 24B, a series of cross-sectional views 1700-2200, 2300A-2300D, 2400A, 2400B of some embodiments of a method for forming an image sensor is provided in which a passivation layer is configured to induce a dipole moment over a photodetector to reduce dark current. FIGS. 23A-23D and FIGS. 24A and 24B are alternatives of each other in which the image sensor is BSI and FSI and each proceed individually from FIGS. 17-22. FIGS. 23A-23D illustrate formation of the image sensor as in FIG. 13, whereas FIGS. 24A and 24B illustrate formation of the image sensor as in FIG. 15.

Figure 17:
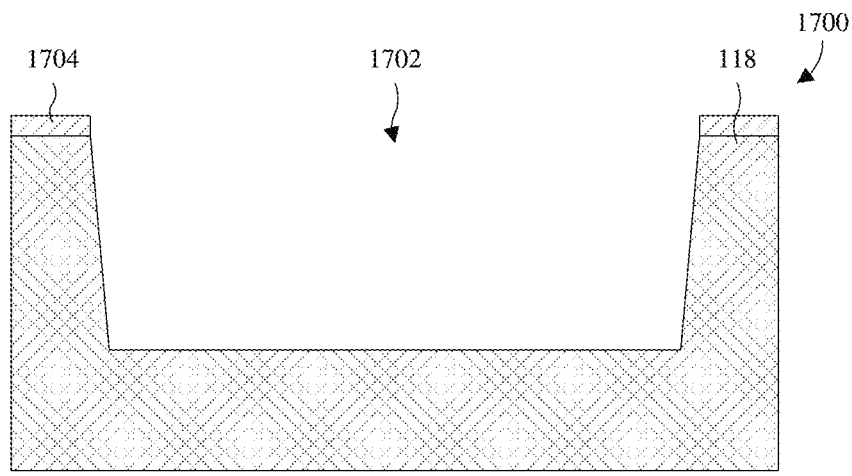
FIGS. 17-22, 23A-23D, 24A, and 24B illustrate a series of cross-sectional views of some embodiments of a method for forming an image sensor in which a passivation layer is configured to reduce dark current.

As illustrated by the cross-sectional view 1700 of FIG. 17, a first substrate 118 is patterned to form a cavity 1702. The first substrate 118 may, for example, be a bulk substrate of monocrystalline silicon or some other suitable type of substrate. In some embodiments, the first substrate 118 is undoped. In other embodiments, the first substrate 118 is doped with P-type or N-type dopants. The patterning to form the cavity 1702 comprise: 1) depositing a hard mask layer 1704 over the first substrate 118; 2) patterning the first substrate 118 by a photolithography/etching process; and 3) performing an etch into the first substrate 118 with the hard mask layer 1704 in place. The hard mask layer 1704 may, for example, be or comprise undoped silicate glass (USG) and/or some other suitable dielectric(s). In alternative embodiments, the patterning to form the cavity 1702 is performed by some other suitable patterning process.

Figure 18:
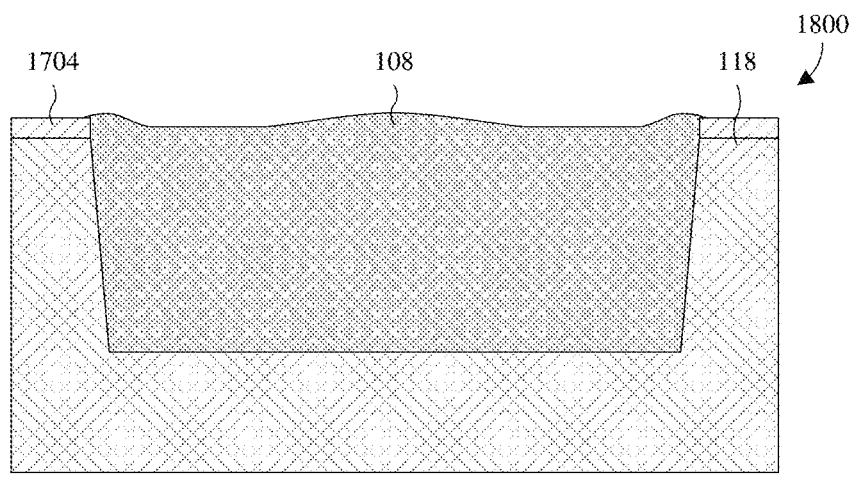

As illustrated by the cross-sectional view 1800 of FIG. 18, a device layer 108 is epitaxially grown filling the cavity 1702 (see, e.g., FIG. 17). Because the device layer 108 is epitaxially grown, the device layer 108 grows outward from exposed surfaces of the first substrate 118 in the cavity 1702. Further, because the hard mask layer 1704 covers the first substrate 118 outside the cavity 1702, the device layer 108 is wholly or mostly localized to the cavity 1702. The device layer 108 is a different semiconductor material than the first substrate 118. For example, the device layer 108 may be germanium or silicon germanium, whereas the first substrate 118 may be silicon. Other suitable materials are, however, amenable in alternative embodiments. In some embodiments, the device layer 108 has a higher absorption coefficient for NIR and/or IR radiation than the first substrate 118. Further, in some embodiments, the device layer 108 has a smaller bandgap than the first substrate 118.

Figure 19:
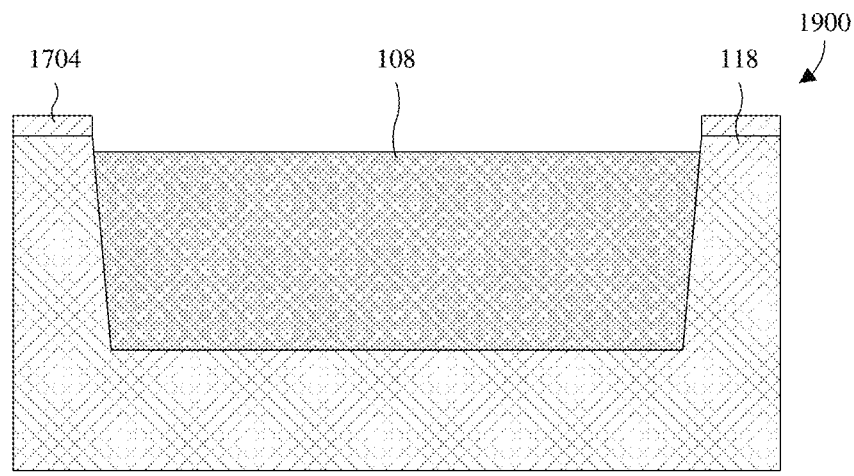

As illustrated by the cross-sectional view 1900 of FIG. 19, a top surface of the device layer 108 is planarized and recessed. The planarization flattens the top surface of the device layer 108, and the recessing recesses the top surface of the device layer 108 relative to a top surface of the first substrate 118. In alternative embodiments, the top surface is not recessed.

In some embodiments, the planarization and the recessing are performed separately. For example, a chemical mechanical polish (CMP) or some other suitable planarization process is performed and then an etch back or some other suitable recessing process is performed. In alternative embodiments, the planarization and the recess are performed together. For example, a sacrificial layer having a top surface that is flat may be formed over the device layer 108. An etch back may then be performed into the sacrificial layer and the device layer 108 using an etchant having the same etch rate, or similar etch rates, for the sacrificial layer and the device layer 108.

Figure 20:
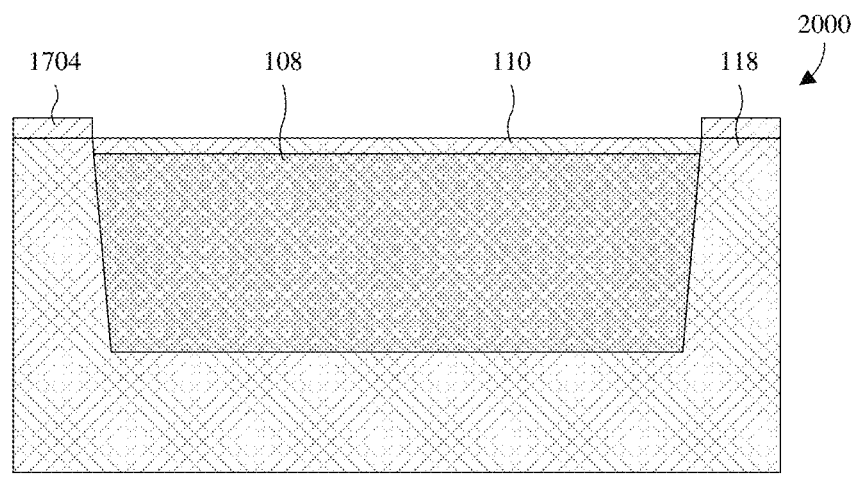

As illustrated by the cross-sectional view 2000 of FIG. 20, a cap layer 110 is epitaxially grown on and covering the device layer 108. Further, the cap layer 110 is epitaxially grown, such that the cap layer 110 grows on the device layer 108 but not the hard mask layer 1704. As such, the cap layer 110 is localized to the device layer 108 by a self-aligned process.

The cap layer 110 is a different semiconductor material than the device layer 108 and may, for example, be or comprise silicon or some other suitable semiconductor material. In some embodiments, the cap layer 110 is the same semiconductor material as the first substrate 118 and/or is undoped. The cap layer 110 protects the device layer 108 from damage during subsequent processing. For example, subsequent wet cleaning processes may use acids that have high etch rates for the device layer 108 but low etch rates for the cap layer 110. As such, the device layer 108 would undergo significant crystalline damage and/or erosion but for the cap layer 110. By preventing erosion and/or crystalline damage, leakage current is reduced.

Figure 21:
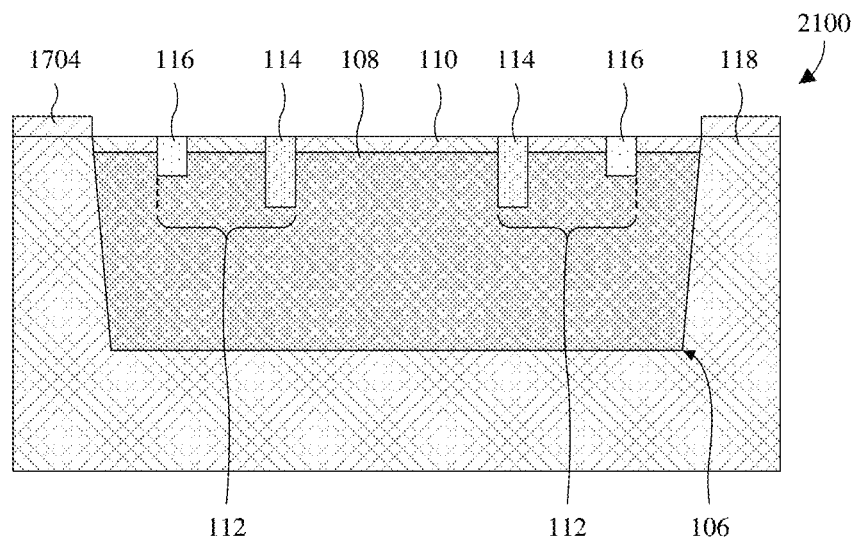

As illustrated by the cross-sectional view 2100 of FIG. 21, a photodetector 106 is formed in the device layer 108 and the cap layer 110. The photodetector 106 comprises a pair of PIN diodes 112 respectively on opposite sides of the device layer 108. The PIN diodes 112 comprise individual P-type contact regions 114 and individual N-type contact regions 116. The P-type contact regions 114 are between the N-type contact regions 116. In alternative embodiments, the N-type contact regions 116 are between the P-type contact regions 114. In alternative embodiments, one of the PIN diodes 112 is omitted.

In some embodiments, the forming comprises: 1) selectively performing ion implantation into the first substrate 118 to form the P-type contact regions 114; and 2) selectively performing ion implantation into the first substrate 118 to form the N-type contact regions 116. In other embodiments, the photodetector 106 is formed by some other suitable process.

As illustrated by the cross-sectional view 2200 of FIG. 22, the hard mask layer 1704 is removed. The removal of the hard mask layer 1704 may, for example, be performed by an etch, a CMP, or some other suitable removal process. In alternative embodiments, the hard mask layer 1704 is not removed and hence persists hereafter.

Also illustrated by the cross-sectional view 2200 of FIG. 22, a high k passivation layer 102 is deposited directly on the cap layer 110 and the first substrate 118. The high k passivation layer 102 is a high k dielectric material with a dielectric constant in excess of 3.9, 10, or some other suitable value. The deposition may, for example, be performed by atomic layer deposition (ALD), vapor deposition, or some other suitable deposition process.

The high k passivation layer 102 reacts with the cap layer 110, thereby inducing formation of an interfacial layer 120 between the high k passivation layer 102 and the cap layer 110. For example, the high k passivation layer 102 and the cap layer 110 may respectively comprise a metal oxide and silicon, such that oxygen of the high k passivation layer 102 reacts with silicon of the cap layer 110 to form the interfacial layer 120 as silicon oxide. Further, the high k passivation layer 102 reacts with the first substrate 118, such that the interfacial layer 120 extends along a top surface of the first substrate 118. The interfacial layer 120 is a dielectric having a different band gap than the high k passivation layer 102 and a smaller areal oxygen density than that of the high k passivation layer 102. Because of the different band gaps, band bending occurs at an interface 122 between the interfacial layer 120 and the high k passivation layer 102. The band bending, in turn, induces formation of a dipole moment 104 at the interface 122. Because the interfacial layer 120 has a smaller areal oxygen density than that of the high k passivation layer 102, negative charge (schematically illustrated by minus signs) accumulates in the high k passivation layer 102 along the interface 122, whereas positive charge (schematically illustrated by plus signs) accumulates in the interfacial layer 120 along the interface 122.

In some embodiments, the cap layer 110 and the first substrate 118 are silicon, the high k passivation layer 102 is a metal oxide, and the interfacial layer 120 is silicon oxide. Other suitable materials are, however, amenable. In some embodiments, the high k passivation layer 102 is or comprises aluminum oxide (e.g., $Al_2O_3$), titanium oxide (e.g., $TiO_2$), tantalum oxide (e.g., $Ta_2O_5$), hafnium oxide ($HfO_2$), zirconium oxide (e.g., $ZrO_2$), magnesium oxide (e.g., MgO), some other suitable high k dielectric(s), or any combination of the foregoing. In some embodiments, the high k passivation layer 102 has a dielectric constant greater than that of the interfacial layer 120 and/or has a smaller bandgap than that of the interfacial layer 120.

In some embodiments, the high k passivation layer 102 has a thickness $T_{hkp}$ of about 1-10 nanometers, about 1-5 nanometers, about 5-10 nanometers, or some other suitable value. If the thickness $T_{hkp}$ is too large (e.g., greater than about 10 nanometers or some other suitable value), intrinsic defects in the high k passivation layer 102 may lead to high leakage current that negates performance gains from the dipole moment 104. If the thickness $T_{hkp}$ is too small (e.g., less than about 1 nanometer or some other suitable value), the dipole moment 104 may not form and hence performance gains from the dipole moment 104 may not result.

In some embodiments, the interfacial layer 120 is or comprises a semiconductor element from the first substrate 118 and further comprises oxygen and/or some other suitable element(s) from the high k passivation layer 102. For example, the interfacial layer 120 may comprise silicon from the first substrate 118 and oxygen from the high k passivation layer 102. In some embodiments, the interfacial layer 120 is or comprise silicon dioxide (e.g., $SiO_2$) and/or some other suitable dielectric(s). In some embodiments, the interfacial layer 120 has a thickness $T_i$ of about 0.5-2.5 nanometers, about 0.5-1.5 nanometers, or about 1.5-2.5 nanometers, or some other suitable value.

During use of the photodetector 106, radiation is emitted towards an object of interest. Radiation that reflects off the object then impinges on the photodetector 106 to generate electron-hole pairs. At different time intervals, the PIN diodes 112 collect mobile electrons of the electron-hole pairs respectively in the N-type contact regions 116. The collected electrons at the different time intervals are then measured and used to determine a distance to the object. The positive charge of the dipole moment 104 draws mobile electrons 124 of dark current in the device layer 108 away from the PIN diodes 112 and neutralizes the mobile electrons 124. By neutralizing the mobile electrons 124, dark current is reduced and does not collect at the N-type contact regions 116 of the PIN diodes 112. As a result, the measurements using the PIN diodes 112 are more accurate and hence the distance determination is more accurate.

In the foregoing discussion of FIG. 22, image sensing by the photodetector 106 is performed by collecting electrons. However, the photodetector 106 may alternatively perform image sensing by collecting holes. In such embodiments, holes are collected at the P-type contact regions 114. Further, a polarity of the dipole moment 104 is reversed. See, for example, FIGS. 5A and 5B. The polarity of the dipole moment 104 may, for example, be reversed by forming the high k passivation layer 102 of a material that has a smaller areal oxygen density than the interfacial layer 120. For example, the high k passivation layer 102 may be or comprises barium oxide (e.g., BaO), strontium oxide (e.g., SrO), lanthanum oxide (e.g., $La_2O_3$), yttrium oxide (e.g., $Y_2O_3$), some other suitable high k dielectric(s), or any combination of the foregoing.

In the foregoing discussion of FIG. 22, the high k passivation layer 102 is deposited directly on the cap layer 110 and the interfacial layer 120 forms by reaction between the high k passivation layer 102 and the cap layer 110. In alternative embodiments, an oxide passivation layer (see, e.g., 902 in FIG. 9) is deposited directly on the cap layer 110 and then the high k passivation layer 102 is deposited directly on the oxide passivation layer. The oxide passivation layer may, for example, be deposited by thermal oxidation, vapor deposition, some other suitable deposition process, or any combination of the foregoing.

The oxide passivation layer is as described at FIG. 9 and, because the oxide passivation layer is formed by deposition, the oxide passivation layer has a higher crystalline quality than the interfacial layer 120. The higher crystalline quality leads to reduced leakage current and enhanced performance of the photodetector 106.

As illustrated by the cross-sectional view 2300A of FIG. 23A, a first interconnect structure 1312 is formed over and electrically coupled to the photodetector 106, thereby defining a first IC structure 1302. The first interconnect structure 1312 comprises a plurality of wires 128, a plurality of vias 126, and a plurality of pads 1316 grouped into levels and alternatingly stacked. The pads 1316 are at a top of the first interconnect structure 1312, and the wires 128 and the vias 126 are alternatingly stacked from the pads 1316 to the photodetector 106.

A bond dielectric layer 1318 is at a top of the first interconnect structure 1312 and surrounds the pads 1316 and the vias 126 at the pads 1316. An etch stop layer 1322 further surrounds the vias 126 at the pads 1316. The high k passivation layer 102 and the interfacial layer 120 surround the vias 126 at the photodetector 106. An interconnect dielectric layer 1320 surrounds the wires 128 and a remainder of the vias 126.

As illustrated by the cross-sectional view 2300B of FIG. 23B, a second IC structure 1304 as described with regard to FIG. 13 is formed. A plurality of logic devices 1308 is formed overlying a second substrate 1310, and a trench isolation structure 1324 is formed separating the logic devices 1308. Further, a second interconnect structure 1314 is formed overlying and electrically coupled to the logic devices 1308.

The second interconnect structure 1314 is similar to the first interconnect structure 1312 and hence comprises a plurality of wires 128, a plurality of vias 126, and a plurality of pads 1316 grouped into levels and alternatingly stacked. The pads 1316 are at a top of the second interconnect structure 1314, and the wires 128 and the vias 126 are alternatingly stacked from the pads 1316 to the logic devices 1308. A bond dielectric layer 1318 is at a top of the second interconnect structure 1314 and surround the pads 1316 and the vias 126 at the pads 1316. An etch stop layer 1322 further surrounds the vias 126 at the pads 1316. An interconnect dielectric layer 1320 surrounds the wires 128 and a remainder of the vias 126.

As illustrated by the cross-sectional view 2300C of FIG. 23C, the first IC structure 1302 is vertically flipped and bonded to the second IC structure 1304. The bond is a hybrid bond in which the pads 1316 of the first and second interconnect structures 1312, 1314 directly contact and in which the bond dielectric layers 1318 of the first and second interconnect structures 1312, 1314 directly contact.

As illustrated by the cross-sectional view 2300D of FIG. 23D, a micro lens 1334 and a metal grid 1336 are formed stacked over the first substrate 118 on a backside of the first substrate 118. Further, an antireflective layer 1340 is between the metal grid 1336 and the first substrate 118, whereas the metal-grid dielectric layer 1342 fills the metal-grid opening 1338 and separates the metal grid 1336 from the micro lens 1334.

As described above, FIGS. 23A-23D illustrate formation of the image sensor as BSI. However, the image sensor may alternatively be FSI. In such alternative embodiments, the acts hereafter described with regard to FIGS. 24A and 24B are performed in place of the acts described with regard to FIGS. 23A-23D. Hence, the method may proceed from FIGS. 17-22 to FIGS. 24A and 24B (while skipping FIGS. 23A-23D) in alternative embodiments.

As illustrated by the cross-sectional view 2400A of FIG. 24A, the first interconnect structure 1312 is formed over and electrically coupled to the photodetector 106. The first interconnect structure 1312 is formed as described with regard to FIG. 23A, except that the pads 1316, the bond dielectric layer 1318, and the etch stop layer 1322 are omitted. Further, the interconnect dielectric layer 1320 of the first interconnect structure 1312 covers a top level of the wires 128.

As illustrated by the cross-sectional view 2400B of FIG. 24B, the micro lens 1334 and the metal grid 1336 are formed stacked over the interconnect structure 1312 on a frontside of the first substrate 118. Further, the antireflective layer 1340 is between the metal grid 1336 and the interconnect structure 1312, whereas the metal-grid dielectric layer 1342 fills the metal-grid opening 1338 and separates the metal grid 1336 from the micro lens 1334.

While FIGS. 17-22, 23A-23D, 24A, and 24B are described with reference to various embodiments of a method, it will be appreciated that the structures shown in FIGS. 17-22, 23A-23D, 24A, and 24B are not limited to the method but rather may stand alone separate of the method. While FIGS. 17-22, 23A-23D, 24A, and 24B are described as a series of acts, it will be appreciated that the order of the acts may be altered in other embodiments. While FIGS. 17-22, 23A-23D, 24A, and 24B illustrate and describe as a specific set of acts, some acts that are illustrated and/or described may be omitted in other embodiments. Further, acts that are not illustrated and/or described may be included in other embodiments.

Figure 25:
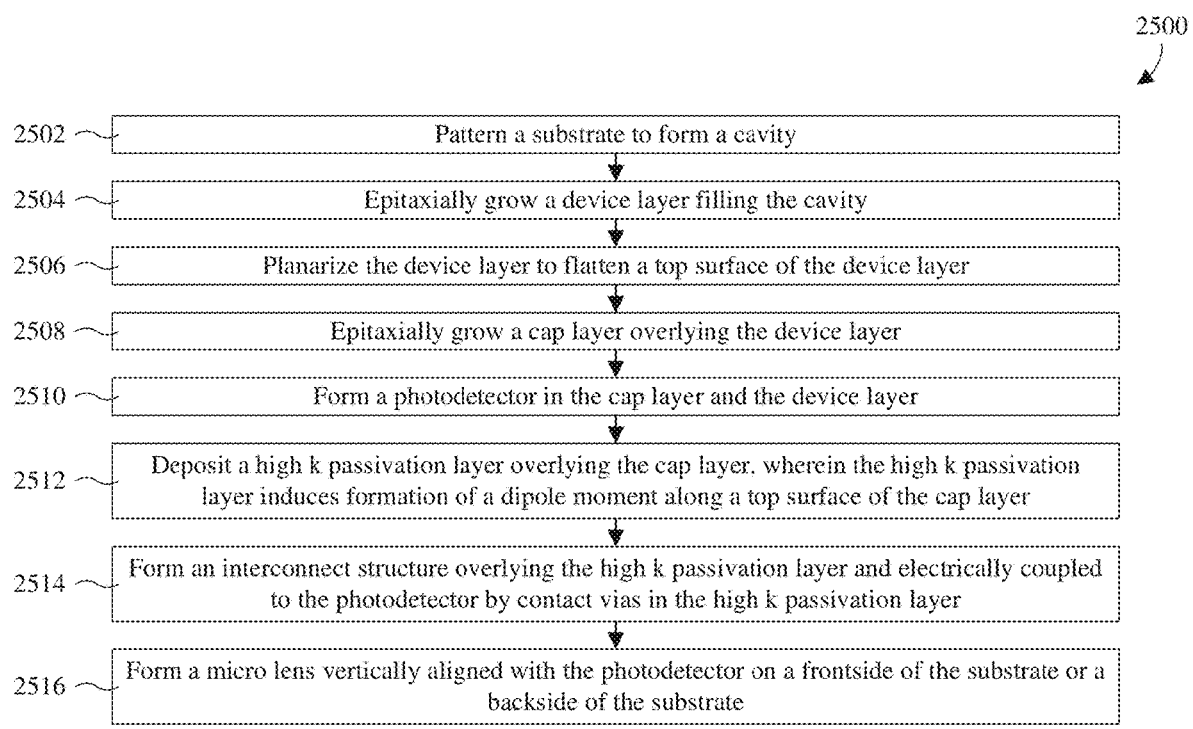
FIG. 25 illustrates a block diagram of some embodiments of the method of FIGS. 17-22, 23A-23D, 24A, and 24B.

With reference to FIG. 25, a block diagram 2500 of some embodiments of the method of FIGS. 17-22, 23A-23D, 24A, and 24B is provided.

At 2502, a substrate is patterned to form a cavity. See, for example, FIG. 17.

At 2504, a device layer is epitaxially grown filling the cavity. See, for example, FIG. 18.

At 2506, the device layer is planarized to flatten a top surface of the device layer. See, for example, FIG. 19.

At 2508, a cap layer is epitaxially grown overlying the device layer. See, for example, FIG. 20.

At 2510, a photodetector is formed in the cap layer and the device layer. See, for example, FIG. 21.

At 2512, a high k passivation layer is deposited overlying the cap layer, wherein the high k passivation layer induces formation of a dipole moment along a top surface of the cap layer. See, for example, FIG. 22. In some embodiments, the high k passivation layer is deposited directly on the cap layer. In other embodiments, an oxide passivation layer is deposited directly on the cap layer and the high k passivation layer is deposited directly on the oxide passivation layer.

At 2514, an interconnect structure is formed overlying the high k passivation layer and electrically coupled to the photodetector by contact vias in the high k passivation layer. See, for example, FIG. 23A or 24A.

At 2516, a micro lens is formed vertically aligned with the photodetector on a frontside of the substrate or a backside of the substrate. See, for example, FIG. 23D or 24B.

While the block diagram 2500 of FIG. 25 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 29:
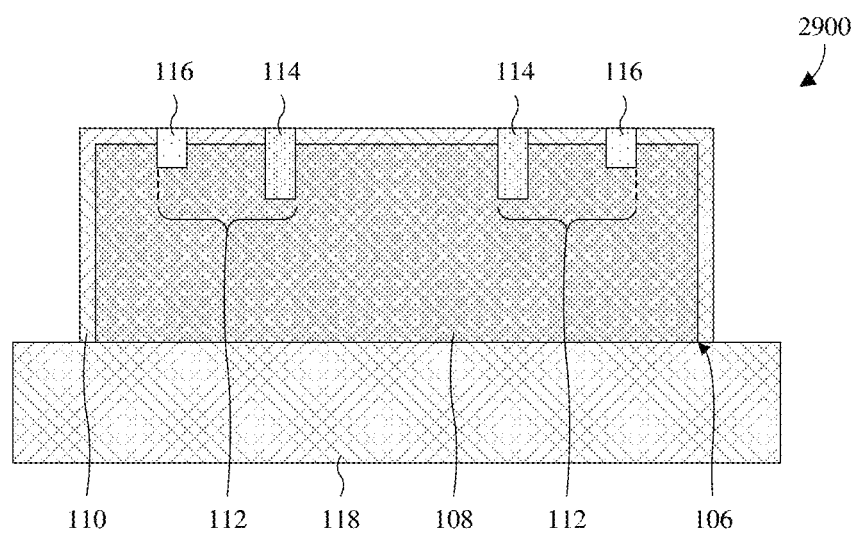
Figure 30:
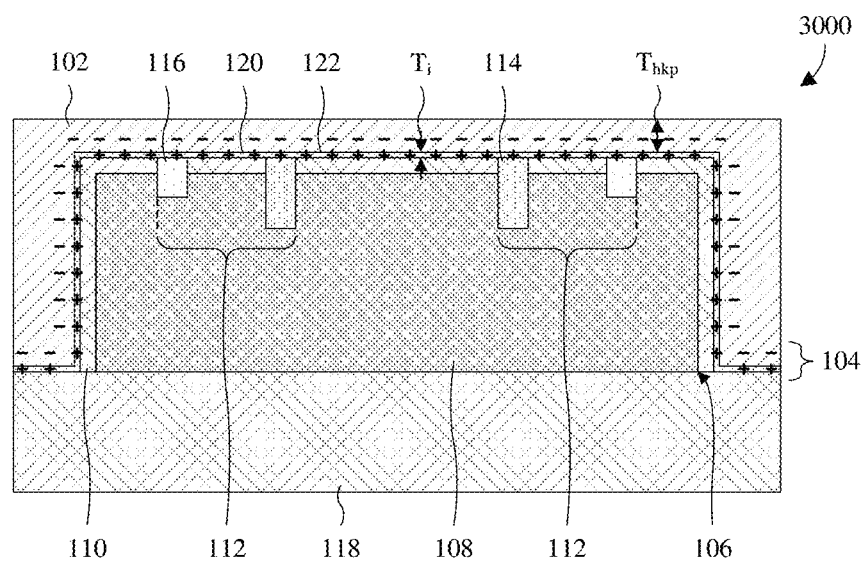
Figure 31:
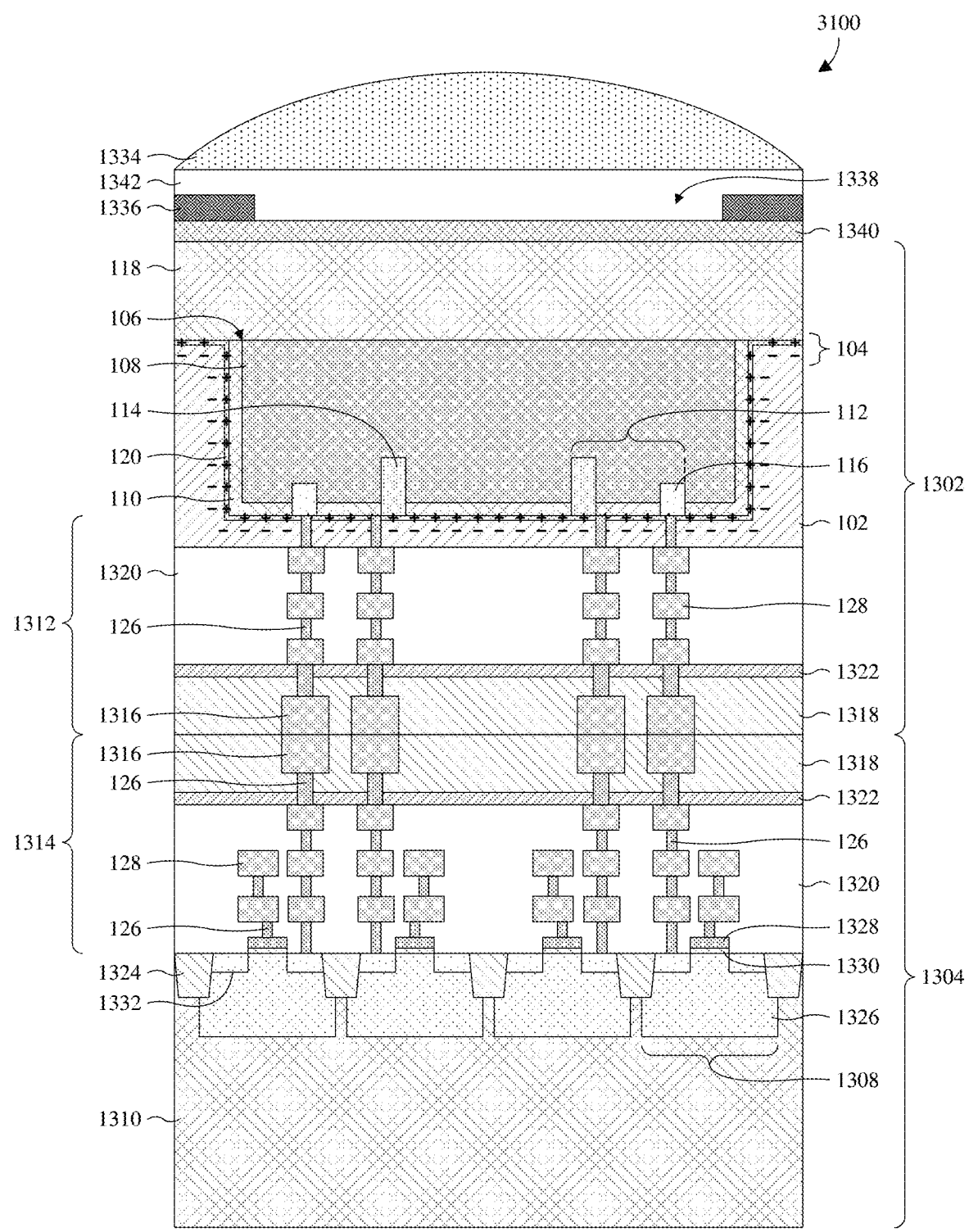
Figure 32:
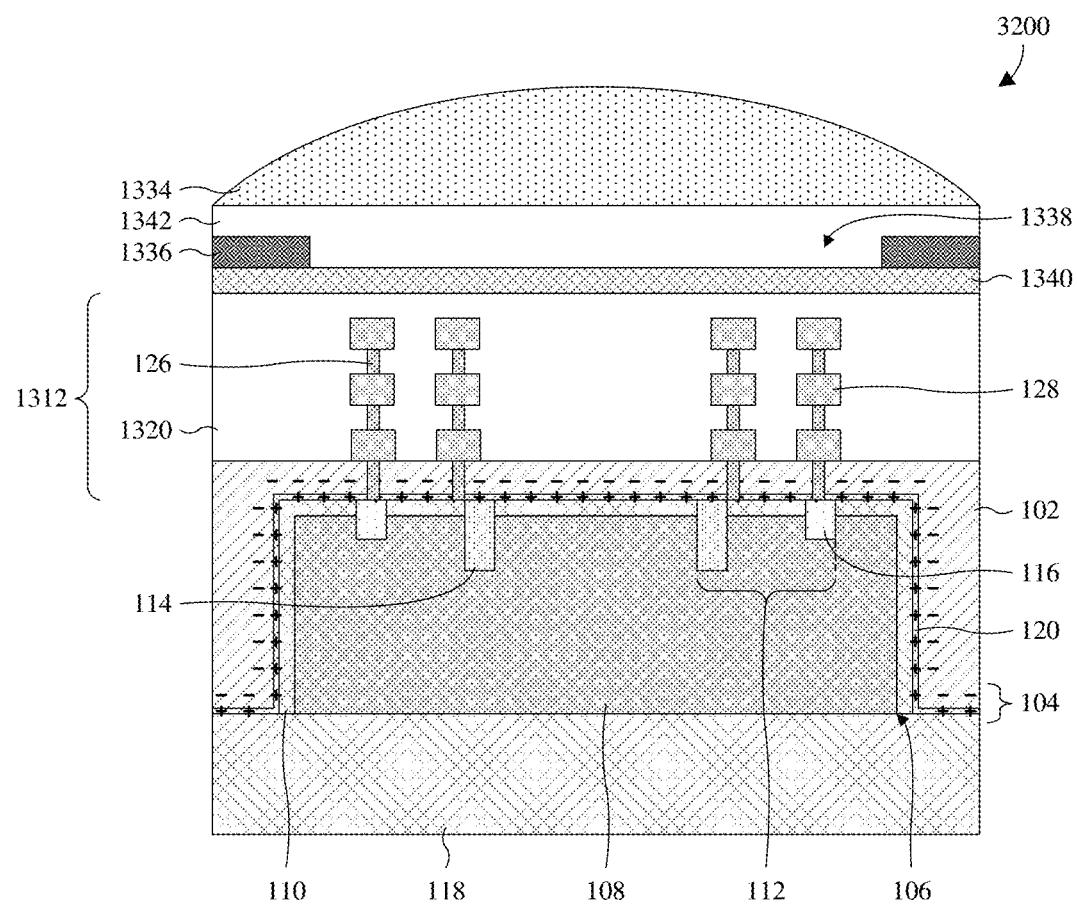

With reference to FIGS. 26-32, a series of cross-sectional views 2600-3200 of some first embodiments of a method for forming an image sensor is provided in which a bottom surface of a device layer is elevated above a top surface of a substrate and in which a passivation layer is configured to induce a dipole moment over a photodetector in the device layer to reduce dark current. FIG. 31 and FIG. 32 are alternatives of each other in which the image sensor is BSI and FSI and each individually proceed from FIGS. 26-30.

Figure 26:
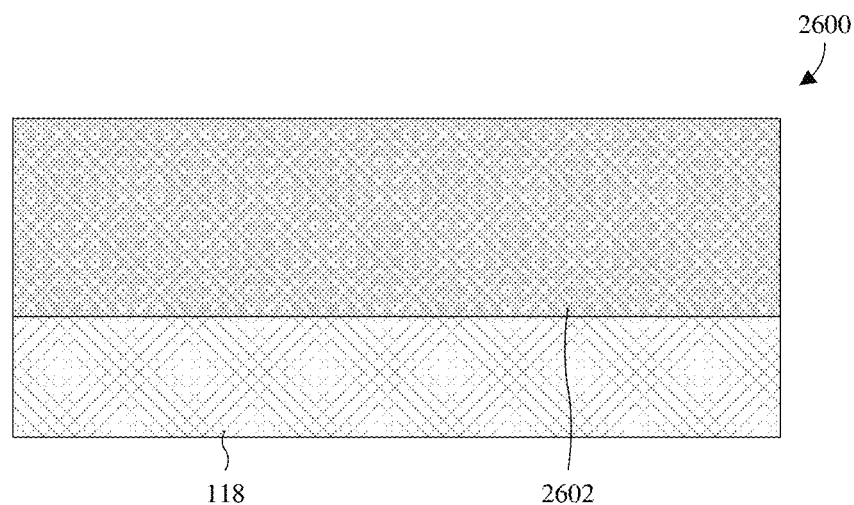
FIGS. 26-32 illustrate a series of cross-sectional views of some first embodiments of a method for forming an image sensor in which a passivation layer is configured to reduce dark current and a bottom surface of a device layer is elevated above a top surface of a substrate.

As illustrated by the cross-sectional view 2600 of FIG. 26, a semiconductor layer 2602 is epitaxially grown covering a first substrate 118. The semiconductor layer 2602 is a different semiconductor material than the first substrate 118. For example, the semiconductor layer 2602 may be germanium or silicon germanium, whereas the first substrate 118 may be silicon. Other suitable materials are, however, amenable in alternative embodiments. In some embodiments, the semiconductor layer 2602 has a higher absorption coefficient for NIR and/or IR radiation than the first substrate 118. In some embodiments, the semiconductor layer 2602 has a smaller bandgap than the first substrate 118.

Figure 27:
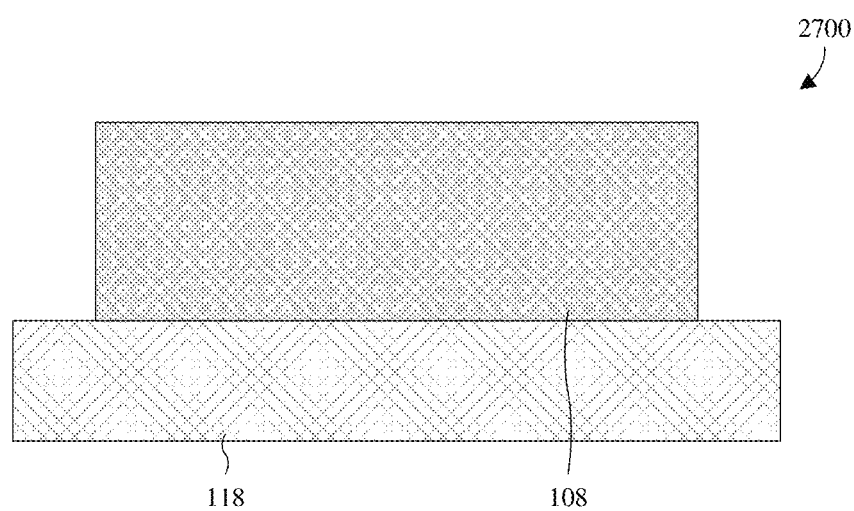

As illustrated by the cross-sectional view 2700 of FIG. 27, the semiconductor layer 2602 (see, e.g., FIG. 26) is patterned to form a device layer 108. The patterning may, for example, comprise: 1) forming a mask over the semiconductor layer 2602; 2) performing an etch into the semiconductor layer 2602 with the mask in place; and 3) removing the mask. The mask may, for example, be a photoresist mask and/or some other suitable type of mask. In other embodiments, the patterning is performed by some other suitable process.

Figure 28:
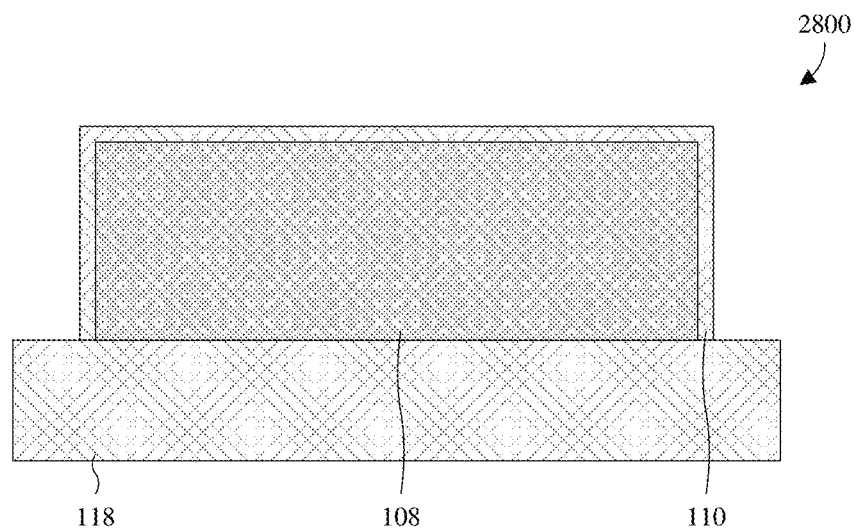

As illustrated by the cross-sectional views 2800-3000 of FIGS. 28-30, acts described with regard to FIGS. 20-22 are respectively performed. At FIG. 28, a cap layer 110 is epitaxially grown on and covering the device layer 108 as described with regard to FIG. 20. Because sidewalls of the device layer 108 are exposed, the cap layer 110 also grows on the sidewalls of the device layer 108. Further, the epitaxial growth is performed so the cap layer 110 grows on the device layer 108 but not the substrate 118. In alternative embodiments, the cap layer 110 also grows on the substrate 118. At FIG. 29, a photodetector 106 is formed in the device layer 108 and the cap layer 110 as described with regard to FIG. 21. At FIG. 30, a high k passivation layer 102 is deposited directly on the cap layer 110 and the first substrate 118, thereby forming an interfacial layer 120, as described with regard to FIG. 22. In alternative embodiments, an oxide passivation layer (see, e.g., 902 of FIG. 12A) is deposited directly on the cap layer 110, and the high k passivation layer 102 is deposited directly on the oxide passivation layer. In alternative embodiments, polarity of the high k passivation layer 102 is reversed (see, e.g., FIGS. 5A, 5B, and 6).

As illustrated by the cross-sectional view 3100 of FIG. 31, the acts described with regard to FIGS. 23A-23D are performed, such that the image sensor is BSI. Particularly, a first interconnect structure 1312 is formed over and electrically coupled to the photodetector 106, thereby defining a first IC structure 1302, as described with regard to FIG. 23A. A second IC structure 1304 is formed as described with regard to FIG. 23B. The first IC structure 1302 is vertically flipped and bonded to the second IC structure 1304 as described with regard to FIG. 23C. A micro lens 1334 and a metal grid 1336 are formed stacked over the first substrate 118 on a backside of the first substrate 118 as described with regard to FIG. 23D.

FIG. 31 illustrates the method forming the image sensor as BSI. However, the method may alternatively form the image sensor as FSI. In such alternative embodiments, the method proceeds from FIGS. 26-30 to FIG. 32 while skipping FIG. 31. Further, the acts described with regard to FIGS. 24A and 24B are performed at FIG. 32. Particularly, a first interconnect structure 1312 is formed over and electrically coupled to the photodetector 106 as described with regard to FIG. 24A. Further, a micro lens 1334 and a metal grid 1336 are formed stacked over the first interconnect structure 1312 on a frontside of the first substrate 118 as described with regard to FIG. 24B.

While FIGS. 26-32 are described with reference to various embodiments of a method, it will be appreciated that the structures shown in FIGS. 26-32 are not limited to the method but rather may stand alone separate of the method. While FIGS. 26-32 are described as a series of acts, it will be appreciated that the order of the acts may be altered in other embodiments. While FIGS. 26-32 illustrate and describe as a specific set of acts, some acts that are illustrated and/or described may be omitted in other embodiments. Further, acts that are not illustrated and/or described may be included in other embodiments.

Figure 33:
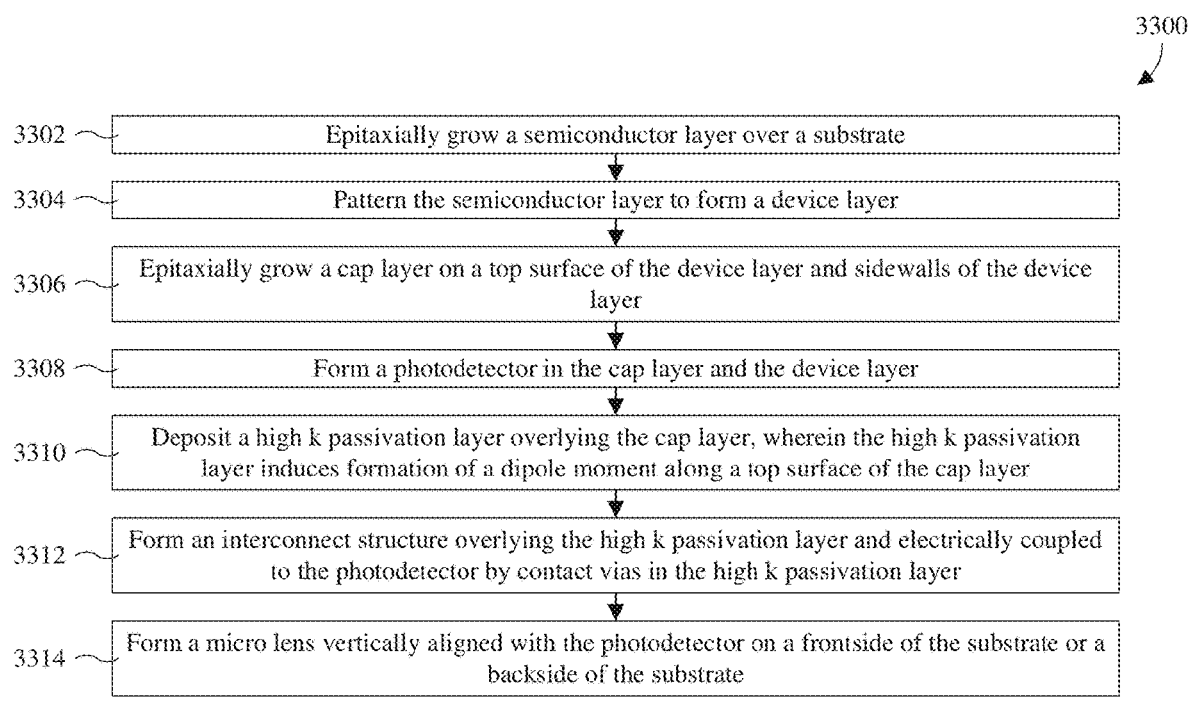
FIG. 33 illustrates a block diagram of some embodiments of the method of FIGS. 26-32.

With reference to FIG. 33, a block diagram 3300 of some embodiments of the method of FIGS. 26-32 is provided.

At 3302, a semiconductor layer is epitaxially grown over a substrate. See, for example, FIG. 26.

At 3304, the semiconductor layer is patterned to form a device layer. See, for example, FIG. 27.

At 3306, a cap layer is epitaxially grown on a top surface of the device layer and sidewalls of the device layer. See, for example, FIG. 28.

At 3308, a photodetector is formed in the cap layer and the device layer. See, for example, FIG. 29.

At 3310, a high k passivation layer is deposited overlying the cap layer, wherein the high k passivation layer induces formation of a dipole moment along a top surface of the cap layer. See, for example, FIG. 30. In some embodiments, the high k passivation layer is deposited directly on the cap layer. In other embodiments, an oxide passivation layer is deposited directly on the cap layer and the high k passivation layer is deposited directly on the oxide passivation layer.

At 3312, an interconnect structure is formed overlying the high k passivation layer and electrically coupled to the photodetector by contact vias in the high k passivation layer. See, for example, FIG. 31 or 32.

At 3314, a micro lens is formed vertically aligned with the photodetector on a frontside of the substrate or a backside of the substrate. See, for example, FIG. 31 or 32.

While the block diagram 3300 of FIG. 33 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

Figure 41:
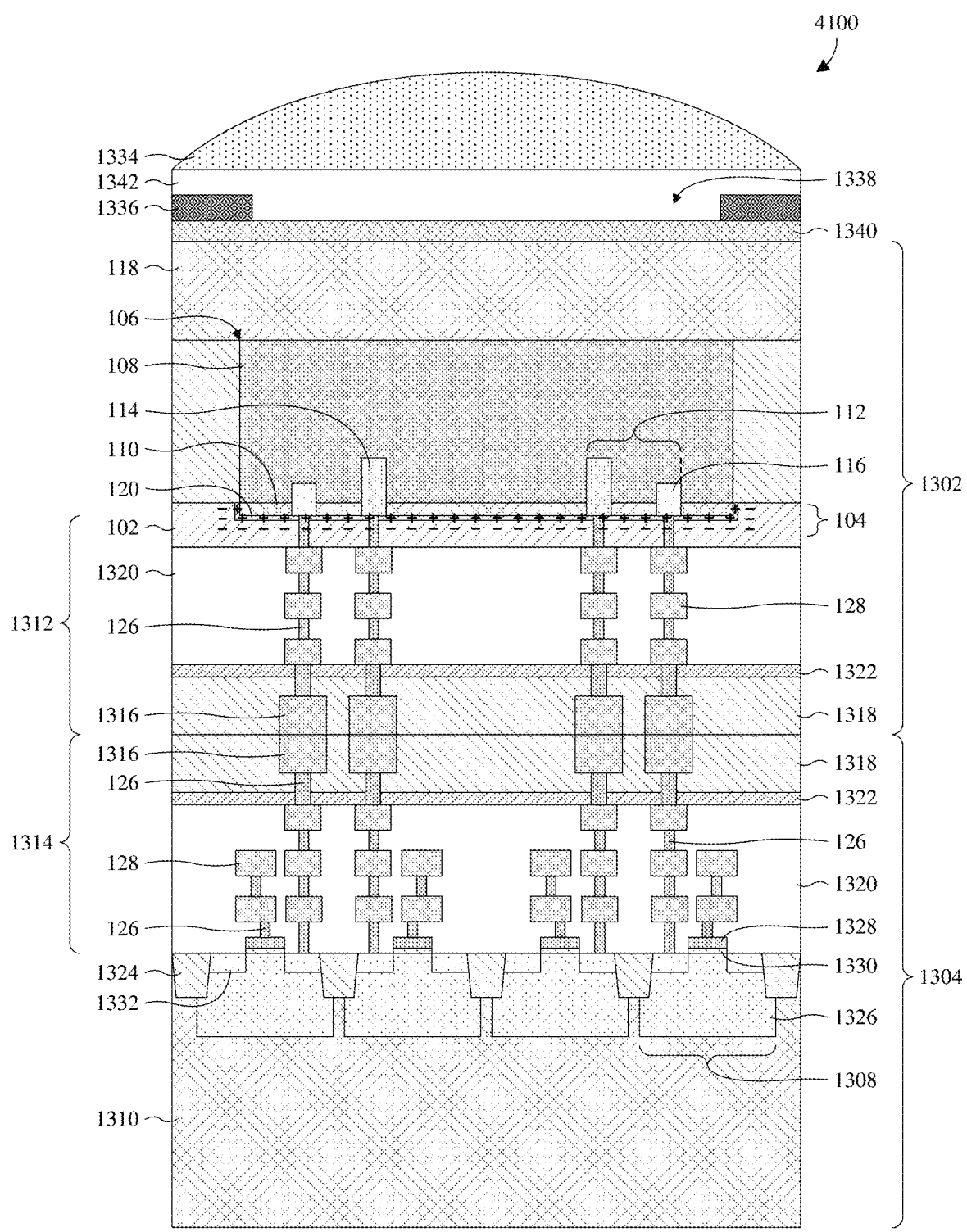
Figure 42:
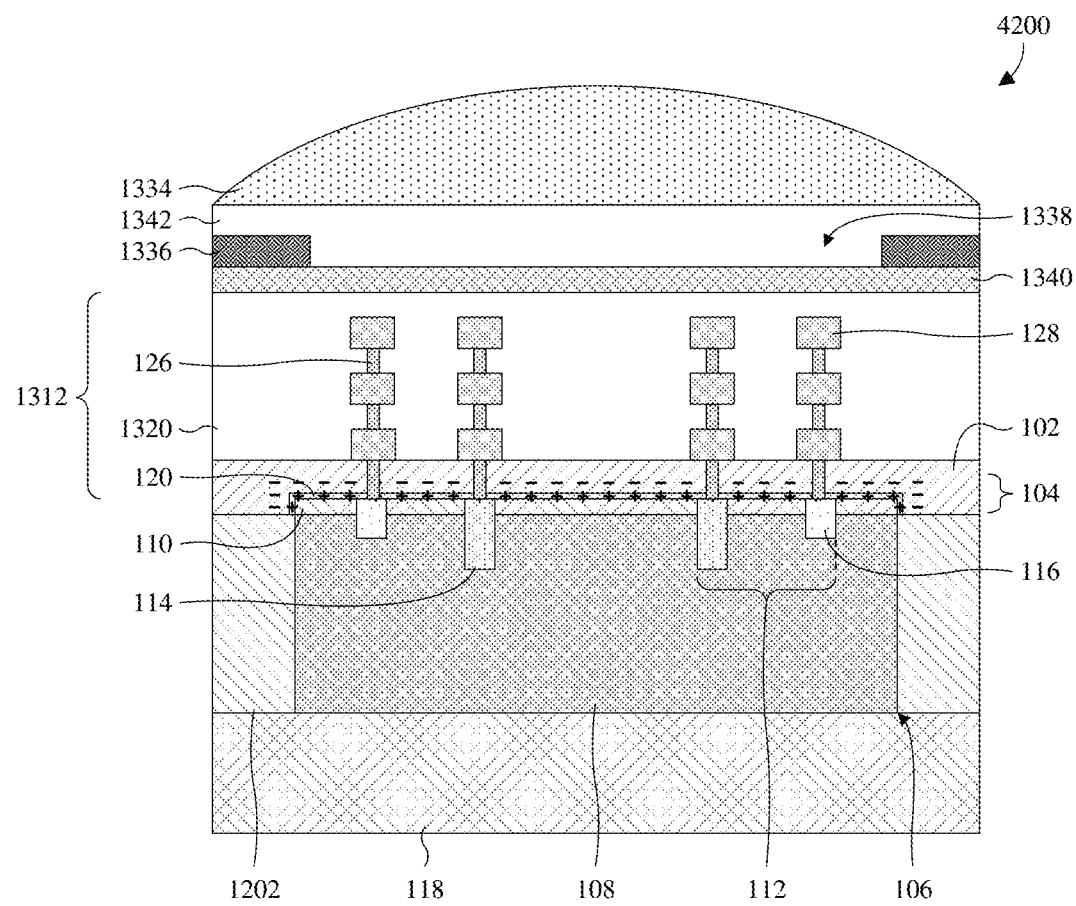

With reference to FIGS. 34-42, a series of cross-sectional views 3400-4200 of some second embodiments of a method for forming an image sensor is provided in which a bottom surface of a device layer is elevated above a top surface of a substrate and in which a passivation layer is configured to induce a dipole moment over a photodetector in the device layer to reduce dark current. FIG. 41 and FIG. 42 are alternatives of each other in which the image sensor is BSI and FSI and each individually proceed from FIGS. 34-40.

Figure 34:
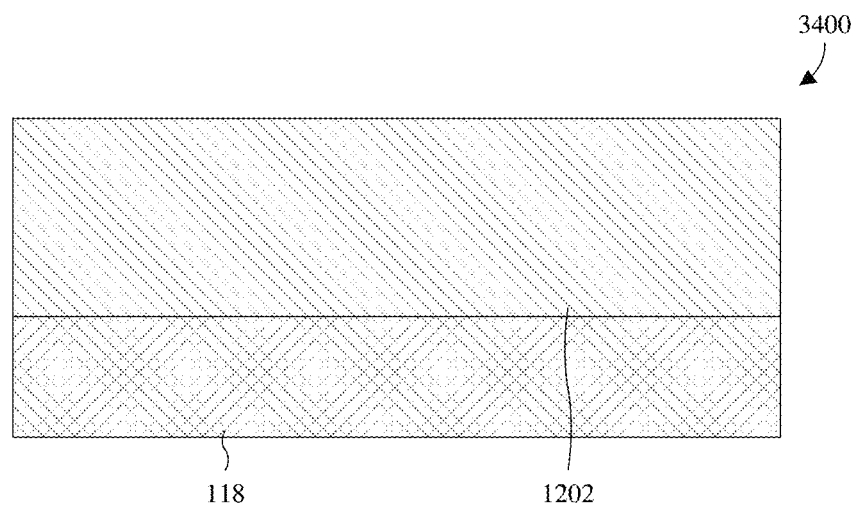
FIGS. 34-42 illustrate a series of cross-sectional views of some second embodiments of a method for forming an image sensor in which a passivation layer is configured to reduce dark current and a bottom surface of a device layer is elevated above a top surface of a substrate.

As illustrated by the cross-sectional view 3400 of FIG. 34, an inter-photodetector dielectric layer 1202 is deposited covering a first substrate 118. The inter-photodetector dielectric layer 1202 may, for example, be or comprise silicon oxide and/or some other suitable dielectric(s). The inter-photodetector dielectric layer 1202 may, for example, be deposited by thermal oxidation, vapor deposition, or some other suitable deposition process.

Figure 35:
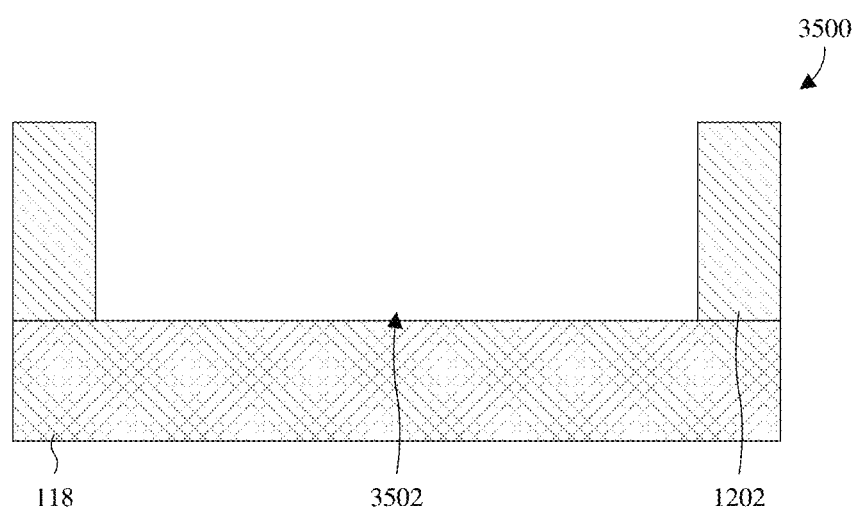
Figure 36:
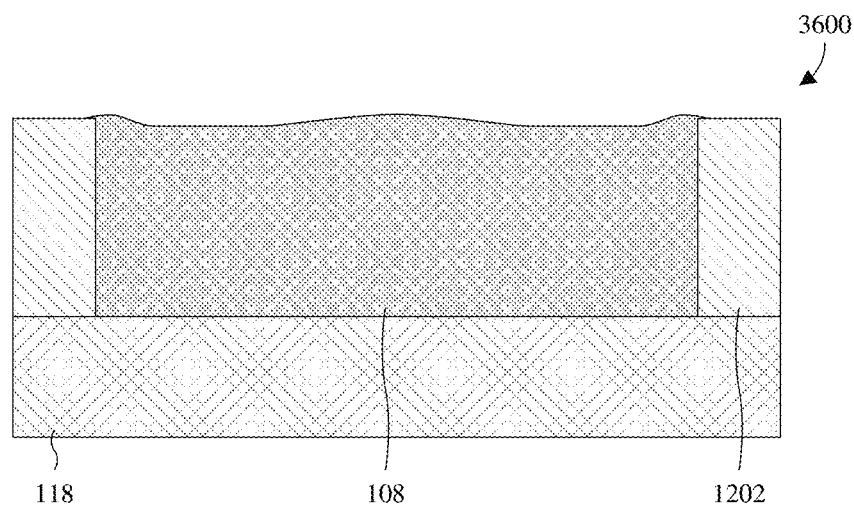
Figure 37:
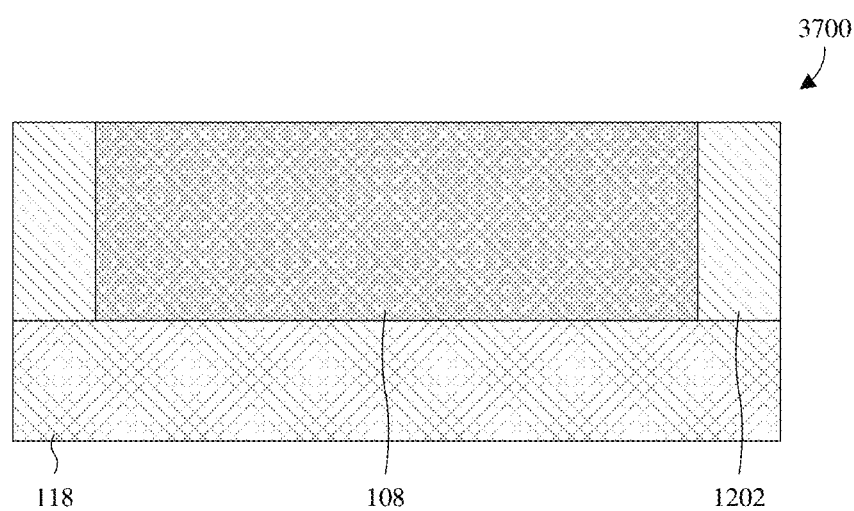
Figure 38:
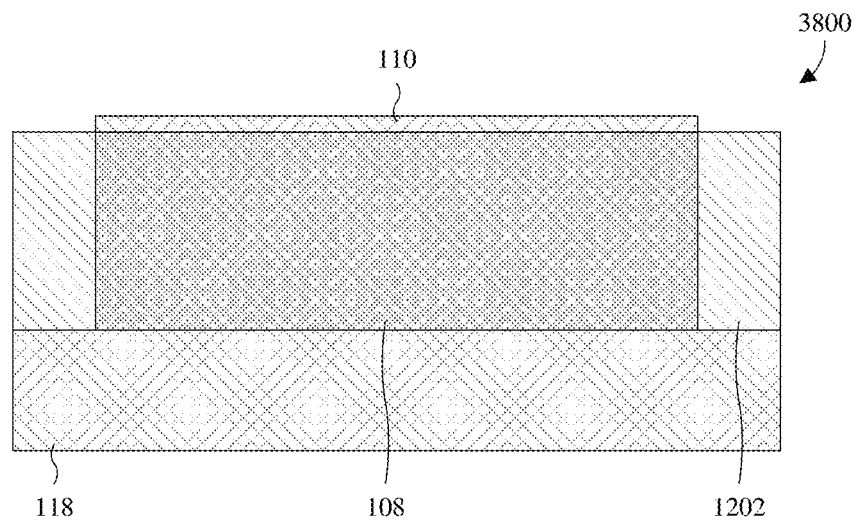
Figure 39:
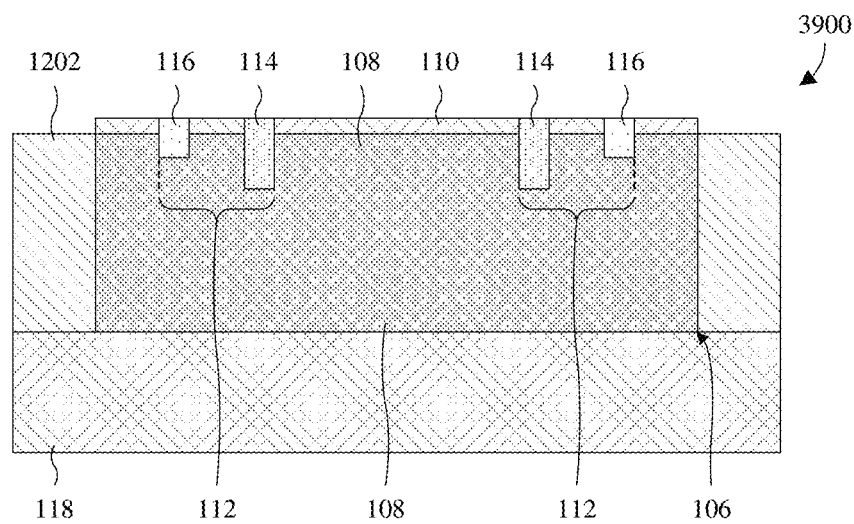
Figure 40:
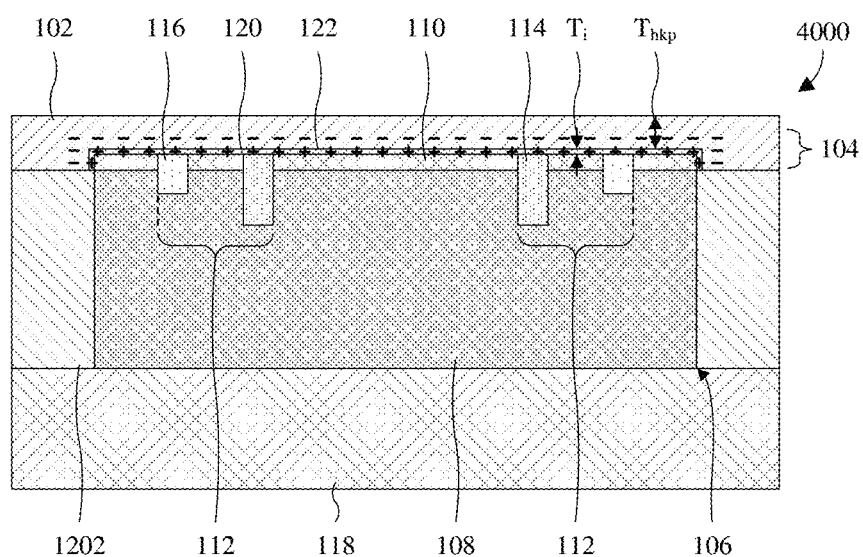

As illustrated by the cross-sectional view 3500 of FIG. 35, the inter-photodetector dielectric layer 1202 is patterned to form a cavity 3502. The patterning may, for example, be performed by a photolithography/etching process or some other suitable patterning process.

As illustrated by the cross-sectional views 3600-4000 of FIGS. 36-40, acts described with regard to FIGS. 18-22 are respectively performed. At FIG. 36, a device layer 108 is epitaxially grown filling the cavity 3502 (see, e.g., FIG. 35) as described with regard to FIG. 18. At FIG. 37, a top surface of the device layer 108 is planarized as described with regard to FIG. 19. However, the top surface of the device layer 108 is not recessed relative to a top surface of the inter-photodetector dielectric layer 1202. In alternative embodiments, the top surface of the device layer 108 is recessed relative to the top surface of the inter-photodetector dielectric layer 1202 according to the recessing of FIG. 19. At FIG. 38, a cap layer 110 is epitaxially grown so it is localized on and covers the device layer 108 as described with regard to FIG. 20. In alternative embodiments, the cap layer 110 is epitaxially grown so it also covers the inter-photodetector dielectric layer 1202. At FIG. 39, a photodetector 106 is formed in the device layer 108 and the cap layer 110 as described with regard to FIG. 21. At FIG. 40, a high k passivation layer 102 is deposited directly on the cap layer 110 and the first substrate 118 as described with regard to FIG. 22. In alternative embodiments, an oxide passivation layer (see, e.g., 902 of FIG. 9) is deposited directly on the cap layer 110, and the high k passivation layer 102 is deposited directly on the oxide passivation layer.

As illustrated by the cross-sectional view 4100 of FIG. 41, the acts described with regard to FIGS. 23A-23D are performed, such that the image sensor is BSI. Particularly, a first interconnect structure 1312 is formed over and electrically coupled to the photodetector 106, thereby defining a first IC structure 1302, as described with regard to FIG. 23A. A second IC structure 1304 is formed as described with regard to FIG. 23B. The first IC structure 1302 is vertically flipped and bonded to the second IC structure 1304 as described with regard to FIG. 23C. A micro lens 1334 and a metal grid 1336 are formed stacked over the first substrate 118 on a backside of the first substrate 118 as described with regard to FIG. 23D.

FIG. 41 illustrates the method forming the image sensor as BSI. However, the method may alternatively form the image sensor as FSI. In such alternative embodiments, the method proceeds from FIGS. 34-40 to FIG. 42 while skipping FIG. 41. Further, the acts described with regard to FIGS. 24A and 24B are performed at FIG. 42. Particularly, a first interconnect structure 1312 is formed over and electrically coupled to the photodetector 106 as described with regard to FIG. 24A. Further, a micro lens 1334 and a metal grid 1336 are formed stacked over the first interconnect structure 1312 on a frontside of the substrate 118 as described with regard to FIG. 24B.

While FIGS. 34-42 are described with reference to various embodiments of a method, it will be appreciated that the structures shown in FIGS. 34-42 are not limited to the method but rather may stand alone separate of the method. While FIGS. 34-42 are described as a series of acts, it will be appreciated that the order of the acts may be altered in other embodiments. While FIGS. 34-42 illustrate and describe as a specific set of acts, some acts that are illustrated and/or described may be omitted in other embodiments. Further, acts that are not illustrated and/or described may be included in other embodiments.

Figure 43:
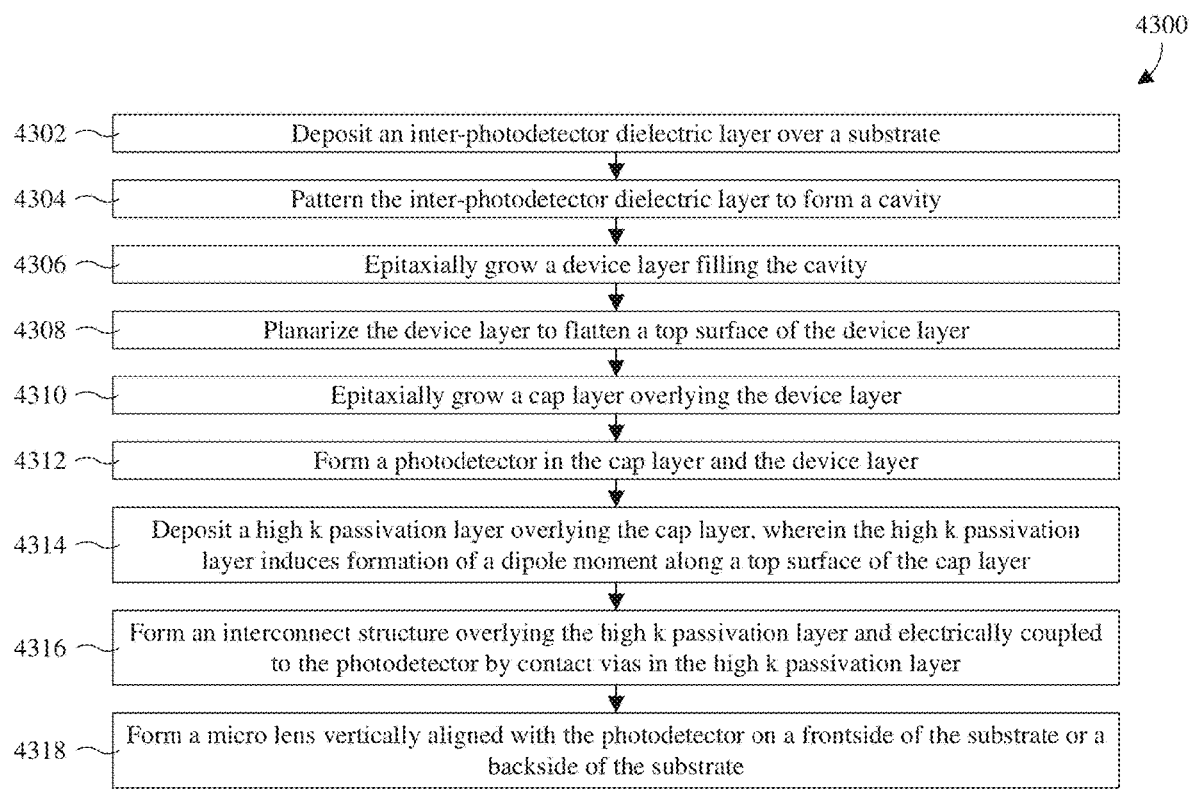
FIG. 43 illustrates a block diagram of some embodiments of the method of FIGS. 34-42.

With reference to FIG. 43, a block diagram 4300 of some embodiments of the method of FIGS. 34-42 is provided.

At 4302, an inter-photodetector dielectric layer is deposited over a substrate. See, for example, FIG. 34.

At 4304, the inter-photodetector dielectric layer is patterned to form a cavity. See, for example, FIG. 35.

At 4306, a device layer is epitaxially grown filling the cavity. See, for example, FIG. 36.

At 4308, the device layer is planarized to flatten a top surface of the device layer. See, for example, FIG. 37.

At 4310, a cap layer is epitaxially grown overlying the device layer. See, for example, FIG. 38.

At 4312, a photodetector is formed in the cap layer and the device layer. See, for example, FIG. 39.

At 4314, a high k passivation layer is deposited overlying the cap layer, wherein the high k passivation layer induces formation of a dipole moment along a top surface of the cap layer. See, for example, FIG. 40. In some embodiments, the high k passivation layer is deposited directly on the cap layer. In other embodiments, an oxide passivation layer is deposited directly on the cap layer and the high k passivation layer is deposited directly on the oxide passivation layer.

At 4316, an interconnect structure is formed overlying the high k passivation layer and electrically coupled to the photodetector by contact vias in the high k passivation layer. See, for example, FIG. 41 or 42.

At 4318, a micro lens is formed vertically aligned with the photodetector on a frontside of the substrate or a backside of the substrate. See, for example, FIG. 41 or 42.

While the block diagram 4300 of FIG. 43 is illustrated and described herein as a series of acts or events, it will be appreciated that the illustrated ordering of such acts or events is not to be interpreted in a limiting sense. For example, some acts may occur in different orders and/or concurrently with other acts or events apart from those illustrated and/or described herein. Further, not all illustrated acts may be required to implement one or more aspects or embodiments of the description herein, and one or more of the acts depicted herein may be carried out in one or more separate acts and/or phases.

In some embodiments, the present disclosure provides an image sensor including: a substrate; a device layer overlying the substrate; a cap layer overlying the device layer, wherein the cap and device layers are semiconductor materials, and wherein the cap layer has a larger bandgap than the device layer; a photodetector in the device and cap layers; and a passivation layer overlying the cap layer, wherein the passivation layer induces formation of a dipole moment along a top surface of the cap layer. In some embodiments, the image sensor further includes an interfacial layer between and directly contacting the passivation layer and the cap layer, wherein the passivation layer is a high k dielectric material. In some embodiments, the passivation layer induces formation of an interfacial layer between and directly contacting the passivation layer and the cap layer, wherein the dipole moment straddles an interface at which the passivation layer and the interfacial layer directly contact. In some embodiments, the passivation layer includes: a silicon oxide layer overlying and directly contacting the cap layer; and a high k dielectric layer overlying and directly contacting the silicon oxide layer, wherein the dipole moment straddles an interface at which the high k dielectric layer and the silicon oxide layer directly contact. In some embodiments, the device layer is inset into the substrate, such that the substrate is on sidewalls of the device layer. In some embodiments, a bottom surface of the device layer is elevated above a top surface of the substrate. In some embodiments, the cap layer wraps around a top corner of the device layer, from a top surface of the device layer to a sidewall of the device layer, and extends along the sidewall of the device layer. In some embodiments, the photodetector includes a pair of PIN diodes in the cap layer and the device layer, and wherein the PIN diodes are respectively on opposite sides of the device layer. In some embodiments, the image sensor further includes a contact via extending through the passivation layer from the photodetector, wherein the passivation layer and the contact via have individual top surfaces that are even.

In some embodiments, the present disclosure provides another image sensor including: a substrate; a device layer overlying the substrate; a cap layer overlying the device layer, wherein the cap and device layers and the substrate are semiconductor materials, and wherein the device layer is a different semiconductor material than the substrate and the cap layer; a photodetector in the device and cap layers; a first dielectric layer overlying and directly contacting the cap layer; and a second dielectric layer overlying and directly contacting the first dielectric layer, wherein the first and second dielectric layers comprise oxide, and wherein the second dielectric layer has a higher dielectric constant than the first dielectric layer. In some embodiments, the first dielectric layer includes a semiconductor element from the cap layer and further includes oxide from the second dielectric layer. In some embodiments, the substrate and the cap layer are silicon, wherein the device layer includes germanium. In some embodiments, the first dielectric layer has negative charge at an interface at which the first and second dielectric layers directly contact, wherein the second dielectric layer has positive charge at the interface. In some embodiments, the first dielectric layer has positive charge at an interface at which the first and second dielectric layers directly contact, wherein the second dielectric layer has negative charge at the interface. In some embodiments, the device layer is recessed into a top of the substrate, wherein the substrate has a p-type implant region lining the device layer. In some embodiments, the device layer has a bottom surface elevated above a top surface of the substrate, wherein the cap layer and the first and second dielectric layers extend along a sidewall of the device layer from top to bottom.

In some embodiments, the present disclosure provides a method for forming an image sensor including: epitaxially growing a device layer overlying a substrate; epitaxially growing a cap layer overlying the device layer, wherein the cap layer has a larger bandgap than the device layer; forming a photodetector in the device and cap layers; and depositing a passivation layer overlying the cap layer, wherein the passivation layer induces formation of a dipole moment along a top surface of the cap layer. In some embodiments, the passivation layer includes a high k dielectric layer, wherein the depositing of the passivation layer includes depositing the high k dielectric layer directly on the cap layer, thereby inducing formation of a silicon oxide interfacial layer between the cap layer and the high k dielectric layer. In some embodiments, the passivation layer includes a silicon oxide layer and a high k dielectric layer, wherein the depositing of the passivation layer includes: depositing the silicon oxide layer directly on the cap layer; and depositing the high k dielectric layer directly on the silicon oxide layer. In some embodiments, the method further includes patterning the substrate to form a cavity, wherein the device layer is epitaxially grown in the cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor, comprising:
   a substrate;
   a device layer overlying the substrate;
   a cap layer overlying the device layer, wherein the cap and device layers are semiconductor materials, and wherein the cap layer has a larger bandgap than the device layer;
   a photodetector in the device and cap layers;
   a passivation layer overlying the cap layer, wherein the passivation layer induces formation of a dipole moment along a top surface of the cap layer and further along a top surface of the substrate, laterally beyond the cap layer; and
   an interfacial layer between the passivation layer and the cap layer.

2. The image sensor according to claim 1, wherein the interfacial layer directly contacts the passivation layer and the cap layer, wherein the passivation layer is a high k dielectric material.

3. The image sensor according to claim 1, wherein the interfacial layer is between and directly contacts the passivation layer and the cap layer, and wherein the dipole moment straddles an interface at which the passivation layer and the interfacial layer directly contact.

4. The image sensor according to claim 1, wherein the device layer is inset into the substrate, such that the substrate is on sidewalls of the device layer.

5. The image sensor according to claim 1, wherein a bottom surface of the device layer is elevated above the top surface of the substrate.

6. The image sensor according to claim 5, wherein the cap layer wraps around a top corner of the device layer, from a top surface of the device layer to a sidewall of the device layer, and extends along the sidewall of the device layer.

7. The image sensor according to claim 1, wherein the photodetector comprises a pair of PIN diodes in the cap layer and the device layer, and wherein the PIN diodes are respectively on opposite sides of the device layer.

8. The image sensor according to claim 1, further comprising:
   a contact via extending through the passivation layer from the photodetector, wherein the passivation layer and the contact via have individual top surfaces that are even.

9. An image sensor, comprising:
   a substrate;
   a device layer overlying the substrate;
   a cap layer overlying the device layer;
   a photodetector in the device and cap layers and comprising a doped contact region;
   a first dielectric layer overlying and directly contacting the cap layer; and
   a second dielectric layer overlying and directly contacting the first dielectric layer, wherein the first and second dielectric layers comprise oxide and partially overlap with a top surface of the doped contact region, and wherein the second dielectric layer has a higher dielectric constant than the first dielectric layer;
   wherein the cap and device layers and the substrate are semiconductor materials, wherein the device layer is a different semiconductor material type than the substrate and the cap layer, and wherein the cap layer has a sidewall facing and directly contacting a sidewall of the substrate.

10. The image sensor according to claim 9, wherein the first dielectric layer and the substrate comprise silicon.

11. The image sensor according to claim 9, wherein the substrate and the cap layer are silicon, and wherein the device layer comprises germanium.

12. The image sensor according to claim 9, wherein the first dielectric layer has negative charge at an interface at which the first and second dielectric layers directly contact, and wherein the second dielectric layer has positive charge at the interface.

13. The image sensor according to claim 9, wherein the first dielectric layer has positive charge at an interface at which the first and second dielectric layers directly contact, and wherein the second dielectric layer has negative charge at the interface.

14. The image sensor according to claim 9, wherein the device layer is recessed into a top of the substrate, and wherein the substrate has a p-type implant region lining the device layer.

15. An image sensor, comprising:
a semiconductor substrate;
a semiconductor device layer recessed into a top of the semiconductor substrate;
a semiconductor cap layer overlying and directly on a top surface of the semiconductor device layer, wherein the semiconductor cap layer is localized to the top surface of the semiconductor device layer;
a photodetector in the semiconductor device layer and the semiconductor cap layer;
a passivation layer overlying the semiconductor cap layer, wherein the passivation layer induces formation of a dipole moment along a top surface of the semiconductor cap layer and has a greater width than the semiconductor cap layer; and
an oxide dielectric layer between the passivation layer and the semiconductor cap layer,
wherein the semiconductor device layer is a different semiconductor material type than the semiconductor cap layer and the semiconductor substrate.

16. The image sensor according to claim 15, wherein a sidewall of the semiconductor device layer faces and directly contacts the semiconductor substrate.

17. The image sensor according to claim 15, further comprising:
an intrinsic semiconductor layer extending along a bottom surface of the semiconductor device layer and a sidewall of the semiconductor device layer to separate the semiconductor device layer from the semiconductor substrate, wherein a top surface of the intrinsic semiconductor layer underlies and directly contacts the oxide dielectric layer.

18. The image sensor according to claim 15, wherein the oxide dielectric layer comprises silicon oxide and directly contacts the top surface of the semiconductor cap layer, wherein the passivation layer comprises a high k dielectric and overlies and directly contacts a top surface of the oxide dielectric layer, and wherein the oxide dielectric layer has a thickness of about 1-10 nanometers.

19. The image sensor according to claim 9, wherein the doped contact region is in the cap layer and the substrate, wherein the second dielectric layer has a sidewall facing a same direction as the sidewall of the cap layer on a same side of the cap layer as the sidewall of the cap layer, and wherein the sidewall of the cap layer is laterally between and offset from the sidewall of the second dielectric layer and the doped contact region.

20. The image sensor according to claim 9, wherein the second dielectric layer induces formation of a dipole moment along a top surface of the cap layer and has a greater width than the cap layer.

* * * * *